(12) United States Patent
Wang et al.

(10) Patent No.: US 7,437,700 B2
(45) Date of Patent: Oct. 14, 2008

(54) AUTOMATED PROCESSOR GENERATION SYSTEM AND METHOD FOR DESIGNING A CONFIGURABLE PROCESSOR

(75) Inventors: Albert Ren-Rui Wang, Fremont, CA (US); Richard Ruddell, Los Gatos, CA (US); David William Goodwin, Sunnyvale, CA (US); Earl A. Killian, Los Altos Hills, CA (US); Nupur Bhattacharyya, Mountain View, CA (US); Marines Puig Medina, San Jose, CA (US); Walter David Lichtenstein, Belmont, MA (US); Pavlos Konas, Mountain View, CA (US); Rangarajan Srinivasan, Los Gatos, CA (US); Christopher Mark Songer, Mountain View, CA (US); Akilesh Parameswar, San Jose, CA (US); Dror E. Maydan, Palo Alto, CA (US); Ricardo E. Gonzalez, Menlo Park, CA (US)

(73) Assignee: Tensilica, Inc., Santa Clara, CA (US)

( * ) Notice: Subject to any disclaimer, the term of this patent is extended or adjusted under 35 U.S.C. 154(b) by 290 days.

(21) Appl. No.: 11/281,217

(22) Filed: Nov. 16, 2005

(65) Prior Publication Data

US 2006/0101369 A1 May 11, 2006

Related U.S. Application Data

(63) Continuation of application No. 09/506,502, filed on Feb. 17, 2000, now Pat. No. 7,036,106.

(51) Int. Cl.
*G06F 17/50* (2006.01)
(52) U.S. Cl. .................... 716/18; 716/1; 716/17
(58) Field of Classification Search ............ 716/1, 716/7, 18
See application file for complete search history.

(56) References Cited

U.S. PATENT DOCUMENTS 5,361,373 A 11/1994 Gilson (Continued)

FOREIGN PATENT DOCUMENTS

EP 0743599 11/1996

(Continued)

OTHER PUBLICATIONS

Compton et al., "Configurable Computing: A Survey of Systems and Software", Tech. Rpt. NW University, Dept of ECE, (1999).

(Continued)

*Primary Examiner*—Thuan Do
(74) *Attorney, Agent, or Firm*—Pillsbury Winthrop et al

(57) ABSTRACT

A system for generating processor hardware supports a language for significant extensions to the processor instruction set, where the designer specifies only the semantics of the new instructions and the system generates other logic. The extension language provides for the addition of processor state, including register files, and instructions that operate on that state. The language also provides for new data types to be added to the compiler to represent the state added. It allows separate specification of reference semantics and instruction implementation, and uses this to automate design verification. In addition, the system generates formatted instruction set documentation from the language specification.

24 Claims, 12 Drawing Sheets

U.S. PATENT DOCUMENTS

| | | | |
|---|---|---|---|
| 5,544,067 A | 8/1996 | Rostoker et al. | |
| 5,555,201 A | 9/1996 | Dangelo et al. | |
| 5,572,437 A | 11/1996 | Rostoker et al. | |
| 5,613,098 A | 3/1997 | Landau et al. | |
| 5,623,418 A | 4/1997 | Rostoker et al. | |
| 5,696,956 A | 12/1997 | Razdan et al. | |
| 5,748,875 A | 5/1998 | Tzori | |
| 5,748,979 A | 5/1998 | Trimberger | |
| 5,801,958 A | 9/1998 | Dangelo et al. | |
| 5,819,064 A | 10/1998 | Razdan et al. | |
| 5,832,205 A | 11/1998 | Kelly et al. | |
| 5,857,106 A | 1/1999 | Barbour et al. | |
| 5,867,399 A | 2/1999 | Rostoker et al. | |
| 5,887,169 A | 3/1999 | Lacombe | |
| 5,889,990 A | 3/1999 | Coleman et al. | |
| 5,896,521 A | 4/1999 | Shackelford et al. | |
| 5,918,035 A | 6/1999 | van Praet et al. | |
| 5,933,356 A | 8/1999 | Rostoker et al. | |
| 5,995,736 A | 11/1999 | Aleksic et al. | |
| 5,999,730 A | 12/1999 | Lewis | |
| 6,006,022 A | 12/1999 | Rhim et al. | |
| 6,028,996 A | 2/2000 | Sniderman et al. | |
| 6,031,992 A | 2/2000 | Cmelik et al. | |
| 6,035,123 A | 3/2000 | Razdan et al. | |
| 6,052,524 A | 4/2000 | Pauna | |
| 6,058,466 A | 5/2000 | Panwar et al. | |
| 6,075,938 A | 6/2000 | Bugnion et al. | |
| 6,078,736 A | 6/2000 | Guccione | |
| 6,216,216 B1 | 4/2001 | Bonola | |
| 6,230,307 B1 | 5/2001 | Davis et al. | |
| 6,269,409 B1 | 7/2001 | Solomon | |
| 6,275,893 B1 | 8/2001 | Bonola | |
| 6,282,633 B1 | 8/2001 | Killian et al. | |
| 6,295,571 B1 | 9/2001 | Scardamalia et al. | |
| 6,321,323 B1 | 11/2001 | Nugroho et al. | |
| 6,385,757 B1 * | 5/2002 | Gupta et al. | 716/1 |
| 6,415,379 B1 | 7/2002 | Keppel et al. | |
| 6,477,683 B1 | 11/2002 | Killian et al. | |
| 6,477,697 B1 | 11/2002 | Killian et al. | |
| 6,496,847 B1 | 12/2002 | Bugnion et al. | |
| 6,615,167 B1 | 9/2003 | Devins et al. | |
| 6,658,578 B1 | 12/2003 | Laurenti et al. | |

FOREIGN PATENT DOCUMENTS

| | | |
|---|---|---|
| EP | 0 772140 | 5/1997 |

OTHER PUBLICATIONS

Hauk et al., "The Chimaera Reconfigurable Functional Unit", Proc. of IEEE Symp. on Field Prog. Custom Comp. Mach., (1997).

Razdan et al., "A High Performance Microarchitecture with Hardware Programmable Function Units", Proc. of Micro 27, (Nov. 1997).

Wang et al., "Hardware/Software Instruction Set Configurability for System on Chip Processors", Proc. of Design Automation Conf, (2001).

Fauth et al., "Describing Instruction Set Processors Using nML", IEEE Comp. Soc., pp. 503-507, (Mar. 6, 1995).

Hartoog et al., "Generation of Software Tools from Processor Descriptions for Hardware/Software Codesign", Proc. of Design Autom Conf., pp. 303-306, (Jun. 9-13, 1997).

Fauth et al., "Generation of Hardware Machine Models from Instruction Set Descriptions", VSLI Signal Processing/IEEE, pp. 242-250, (Oct. 20, 1993).

Box et al., "Field Programmable Gate Array Based Reconfigurable Preprocessor", IEEE Workshop on FPGAs for Cust. Comp. Mach., pp. 40-48, (Oct. 13, 1994).

Gonzalez et al., "Configurable and Extensible Processor Change System Design", Tensilica, Inc. Hot Chips, (1999).

"Accelerated Technology and Tensilica Alliance Provide Comprehensive Hardware and Software Solution with Nucleus Plus Support for the Extensa Processor", Embedded Sys. Conf-Press Release, (Spring 2000).

Stewart et al., "The Chimaera II Real Time Operating System for Advanced Sensor Based Control Applications", IEEE Trans. on System, 22(6):1282-1295 (1992).

Lecarme et al., "Software Portability," McGraw Hill, Inc. (1996).

Singh et al., ""Accelerating Adobe Photoshop with Reconfigurable Logic"," FPGAs for Custom. Comp. Mach., p. 236-244, XP-010298165 (1998).

Bursky, ""Tool Suite Enables Designers to Craft Customized Embedded Processors"," Ele. Desig.-USA OnLine!, Penton Publishing, vol. 47 (No. 3), (1999).

* cited by examiner

MAX40                               4 Parallel 40-bit Maximum

Instruction Word

| 23         | 16 | 15 | 12 | 11 | 8 | 7 | 4 | 3    | 0 |
|------------|----|----|----|----|---|---|---|------|---|
| 0 0 1 1 1 1 0 1 | | r | | s | | t | | 0 0 0 0 | |
| 8          |    | 4  |    | 4  |   | 4 |   | 4    |   |

Package

Vector Integer Coprocessor

Assembler Syntax

MAX40 vr, vs, vt

Description

MAX40 calculates the 40-bit two's complement maximum value for each of the 4 elements of vector registers vs and vt. The result elements are written to vector register vr.

Operation vr = {((({~vs[159], vs[158:120]}) < ({~vt[159], vt[158:120]})) ? vt[159:120] : vs[159:120], (({~vs[119], vs[118:80]}) < ({~vt[119], vt[118:80]})) ? vt[119:80] : vs[119:80], (({~vs[79], vs[78:40]}) < ({~vt[79], vt[78:40]})) ? vt[79:40] : vs[79:40], (({~vs[39], vs[38:0]}) < ({~vt[39], vt[38:0]})) ? vt[39:0] : vs[39:0]};

Exceptions

None

FIG. 12

AUTOMATED PROCESSOR GENERATION SYSTEM AND METHOD FOR DESIGNING A CONFIGURABLE PROCESSOR

CROSS-REFERENCE TO RELATED APPLICATIONS

This application is a continuation of U.S. patent application Ser. No. 09/506,502 filed Feb. 17, 2000, now U.S. Pat. No. 7,036,106 issued Apr. 25, 2006, which is related to U.S. patent application Ser. No. 09/246,047 now U.S. Pat. No. 6,477,683 issued Nov. 5, 2002 to Killian et al. and U.S. patent application Ser. No. 09/323,161 now U.S. Pat. No. 6,701,515 issued Mar. 2, 2004 to Wilson et al. entitled "System and Method for Dynamically Designing and Evaluating Configurable Processor Instructions", both of which are hereby incorporated by reference; and also is related to the U.S. patent application Ser. No. 09/506,433 filed Feb. 17, 2000, now U.S. Pat. No. 6,763,327 issued Jul. 13, 2004 to Songer et al. entitled "Abstraction of Configurable Processor Functionality for Operating Systems Portability".

BACKGROUND OF THE INVENTION

The present invention is directed to computer processors as well as systems and techniques for developing the same, and is more particularly directed to processors which have features configurable at the option of a user and related development systems and techniques.

Background Of The Related Art

Prior art processors have generally been fairly rigid objects which are difficult to modify or extend. A limited degree of extensibility to processors and their supporting software tools, including the ability to add register-to-register computational instructions and simple state (but not register files) has been provided by systems such as those described in the above Killian et al. and Wilson et al. applications. This limited extensibility was a significant advance in the state of the art; many applications using these improvements see speedups or efficiency improvements of four times or better.

However, the limitations on extensibility of these prior art systems meant that other applications could not be adequately addressed. In particular, the need to use the existing core register file, with its fixed 32-bit width registers, generally prevents the use of these improvements in applications that require additional precision or replicated functional units where the combined width of the data operands exceeds 32 bits. In addition, the core register file often lacks sufficient read or write ports to implement certain instructions. For these reasons, there is a need in the art to support the addition of new register files that are configurable in width and in number of read and write ports.

With the addition of register files comes the need to transfer data between these files and memory. The core instruction set includes such load and store instructions for the core register file, but additional register files require additional load and store instructions. This is because one of the rationales for extensible register files is to allow them to be sized to required data types and bandwidths. In particular, the width of register file data may be wider than that supported by the rest of the instruction set. Therefore, it is not reasonable to load and store data by transferring the data to the registers provided by the core; it should be possible to load and store values from the new register file directly.

Further, although prior art systems support the addition of processor state, the quantity of that state is typically small. Consequently, there is a need in the art for a larger number of state bits to be easily added to the processor architecture. This state often needs to be context switched by the operating system. Once the quantity of state becomes large, new methods that minimize context switch time are desirable. Such methods have been implemented in prior art processors (e.g., the MI R2000 coprocessor enable bits). However, there is a need in the art to extend this further by generating the code sequences and logic automatically from the input specification to support real-time operating systems (RTOSes) and other software which need to know about new state and use it in a timely manner.

Further, prior art processors do not allow for sharing of logic between the core processor implementation and instruction extensions. With load and store instruction extensions, it is important that the data cache be shared between the core and the extensions. This is so that stores by newly-configured instructions are seen by loads by the core and vice versa to ensure cache coherency—separate caches would need special mechanisms to keep them consistent, a possible but undesirable solution. Also, the data cache is one of the larger circuits in the core processor, and sharing it promotes a reduction in the size of the core processor.

The addition of register files also makes it desirable to support allocation of high-level language variables to these registers. Prior art processors use the core register file to which prior art compilers already support allocation of user variables. Thus, compiler allocation is expected and should be supported for user-defined register files. To allocate variables to registers, a compiler supporting user-defined register files requires knowledge of how to spill, restore, and move such registers in order to implement conventional compiler functionality.

A related but more general limitation of prior art processor systems is the level of compiler support therefor. Often instructions are added to a processor to support new data types appropriate to the application (e.g., many DSP applications require processors implementing saturating arithmetic instead of the more conventional two's complement arithmetic usually supported by processors). Prior art systems allow instructions supporting new data types to be added, but it is necessary to map these new instructions to existing language data types when writing high-level language code that uses the extensions. In some cases an appropriate built-in data type may not exist.

For example, consider the saturating arithmetic example. As noted above, many DSP algorithms take advantage of arithmetic that saturates at the minimum value on underflow or maximum value on overflow of the number of bits used instead of wrapping, as in traditional two's complement systems. However, there is no C data type that has these semantics—the C language requires that int a;
    intb;
    int c=a+b;

have wrapping semantics. One could write int a;
    int b;
    int c=SATADD(a, b);

instead using built-in types with new intrinsic functions, but this is awkward and obscures the algorithm (the writer thinks of the SATADD function simply as +).

On the other hand, adding new data types allows the + operator to function differently with those types—C already applies it to different operations for integer addition and floating-point addition operations, so the extension is natural. Thus, using new data types saturating addition might be coded as dsp16 a;
    dsp16 b;
    dsp16 c=a+b;

where dsp16 defines a saturating data type. Thus, the last line implies a saturating add because both of its operands are saturating data types.

Most compilers schedule instructions to minimize pipeline stalls. However, with prior art systems there is no way the instruction specification may be used to extend the compiler's scheduling of data structures. For example, load instructions are pipelined with a two-cycle latency. Thus, if you reference the result of a load is reference on the next instruction after the load, there will be a one-cycle stall because the load is not finished. Thus, the sequence load r1, addr1
    store r1, addr2
    load r2, addr3
    store r2, addr4 will have two stall cycles. If the compiler rearranges this to load r1, addr1
    load r2, addr3
    store r1, addr2
    store r2, addr4 then the sequence executes with no stall cycles. This is a common optimization technique called instruction scheduling. Prior art instruction scheduling requires tables giving the pipe stages that instructions use their inputs and outputs but does not make use of such information for newly-added instructions.

Another limitation of the prior art is that the computation portion of added instructions must be implemented in a single cycle of the pipeline. Some computations, such as multiplication of large operands, have a logic delay longer than the typical RISC pipeline stage. The inclusion of such operations using prior art techniques would require that the processor clock rate be reduced to provide more time in which to complete the computation. It would therefore desirable to support instructions where the computation is spread out over several pipeline stages. In addition to allowing the computation to be performed over multiple cycles, it could be useful to allow operands to be consumed and produced in different pipeline stages.

For example, a multiply/accumulate operation typically requires two cycles. In the first cycle, the multiplier produces the product in carry-save form; in the second cycle the carry-save product and the accumulator are reduced from three values to two values using a single level of carry-save-add, and then added in a carry-propagate-adder. So, the simplest declaration would be to say that multiply/accumulate instructions take two cycles from any source operand to the destination; however, then it would not be possible to do back-to-back multiply/accumulates into the same accumulator register, since there would be a one-cycle stall because of the two-cycle latency. In reality, however, the logic only requires one cycle from accumulator in to accumulator out, so a better approach is just to provide a more powerful description, such as $D \leftarrow A+B*C$ being described as taking B and C in stage 1, taking A in stage 2, and producing D in stage 3. Thus, the latency from B or C to D is 3−1=2, and the latency from A to D is 3−2=1.

With the addition of multi-cycle instructions, it also becomes necessary to generate interlock logic appropriate to the target pipeline for the added instructions. This is because with one instruction per cycle issue, no latency one instruction can produce a result that will cause an interlock on the next cycle, because the next instruction is always delayed by one cycle. In general, if you can only issue instructions only every K cycles, the latency of those instructions is L cycles and L≧K, then those instructions cannot cause interlocks on their destination operand (instructions can still interlock on their source operands if their source operands were produced by a two-cycle instruction such as a load). If it is possible to have two-cycle newly-configured instructions, there is a need to have following instructions that interlock on the result of the newly-configured instructions.

Most instruction set architectures have multiple implementations for different processor architectures. Prior art systems combined the specification of the instruction semantics and the implementation logic for instructions and did not separate these, which might allow one set of reference semantics to be used with multiple implementations. Reference semantics are one component of instruction set documentation. It is traditional to describe instruction semantics in both English and a more precise notation. English is often ambiguous or error-prone but easier to read. Therefore, it provides the introduction, purpose and a loose definition of an instruction. The more formal definition is useful to have a precise understanding of what the instruction does. One of the purposes of the reference semantics is to serve as this precise definition. Other components include the instruction word, assembler syntax, and text description. Prior art systems have sufficient information in the extension language to generate the instruction word and assembler syntax. With the addition of the reference semantics, only the text description was missing, and there is a need to include the specification of instruction descriptions that can be converted to formatted documentation to produce a conventional ISA description book.

Processor development techniques including the above features would render design verification methods of the prior art no longer valid due to their increased flexibility and power. In conjunction with the above features, therefore, there is a need to verify the correctness of many aspects of the generated processor, including:

the correctness of the input reference instruction semantics;

the correctness of the input implementation instruction semantics;

the translation by the compiler of instruction semantics to the application programming language;

the translation by the instruction semantics compiler to the Hardware Description Language (HDL);

the translation by the instruction semantics compiler to the instruction set simulator programming language;

the HDL generated by the instruction semantics compiler for the register files, interlock, bypass, core interface, and exceptions;

any system function abstraction layers generated during the process, such as the Hardware Abstraction Layer (HAL) code generated by the instruction semantics compiler (see the aforementioned Songer et al. patent application for further details on the HAL); and the intrinsic and data type support in the programming language compiler.

The reference semantics are also used in some of the above.

Finally, all of the new hardware functionality must be supported by the instruction set

SUMMARY OF THE INVENTION

In view of the above problems of the prior art, it is an object of the present invention to provide a processor development system which allows extensibility of a wide variety of processor features including the addition of new register files that are configurable in width and in number of read and write ports.

It is a further object of the present invention to provide a processor development system which supports the addition of instructions for transferring data between such new register files and memory.

It is another object of the present invention to provide a processor development system which supports the sharing of logic between the core processor implementation and instruction extensions, particularly sharing of the data cache between the core and extension instructions.

It is an additional object of the present invention to provide a processor development system which supports compiler allocation of high-level language variables to extended register files, including the ability to spill, restore and move such registers.

It is a still further object of the present invention to provide a processor development system which supports instructions where computation is spread out over several pipeline stages.

It is another object of the present invention to provide a processor development system which allows operands to be consumed and produced in different pipeline stages.

It is an even further object of the present invention to provide a processor development system which supports the generation of interlock logic appropriate to the target pipeline for added multi-cycle instructions.

It is yet an additional object of the present invention to provide a processor development system which uses instruction specifications to extend its compiler's scheduling of data structures to minimize pipeline stalls.

It is still another object of the present invention to support specification of instruction semantics and implementation logic for instructions to allow one set of reference semantics to be used with multiple instruction implementations.

It is another object of the present invention to provide a processor development system which can make use of the specification of instruction descriptions for conversion to formatted documentation.

It is yet another object of the present invention to provide a processor development system which is able to verify a wide range of extensible features of processor design.

It is still a further object of the present invention to provide a processor development system which can generate code sequences and logic for minimal time context switching automatically from the input specification It is yet another object of the present invention to provide a processor development system including an instruction set simulator which can support a wide variety of extensible functions as described above.

BRIEF DESCRIPTION OF THE DRAWINGS

These and other objects, features, and advantages of the present invention are better understood by reading the following detailed description of the preferred embodiment, taken in conjunction with the accompanying drawings, in which:

FIG. 12 shows automatically-generated instruction documentation according to the preferred embodiment;

DETAILED DESCRIPTION

Figure 1:
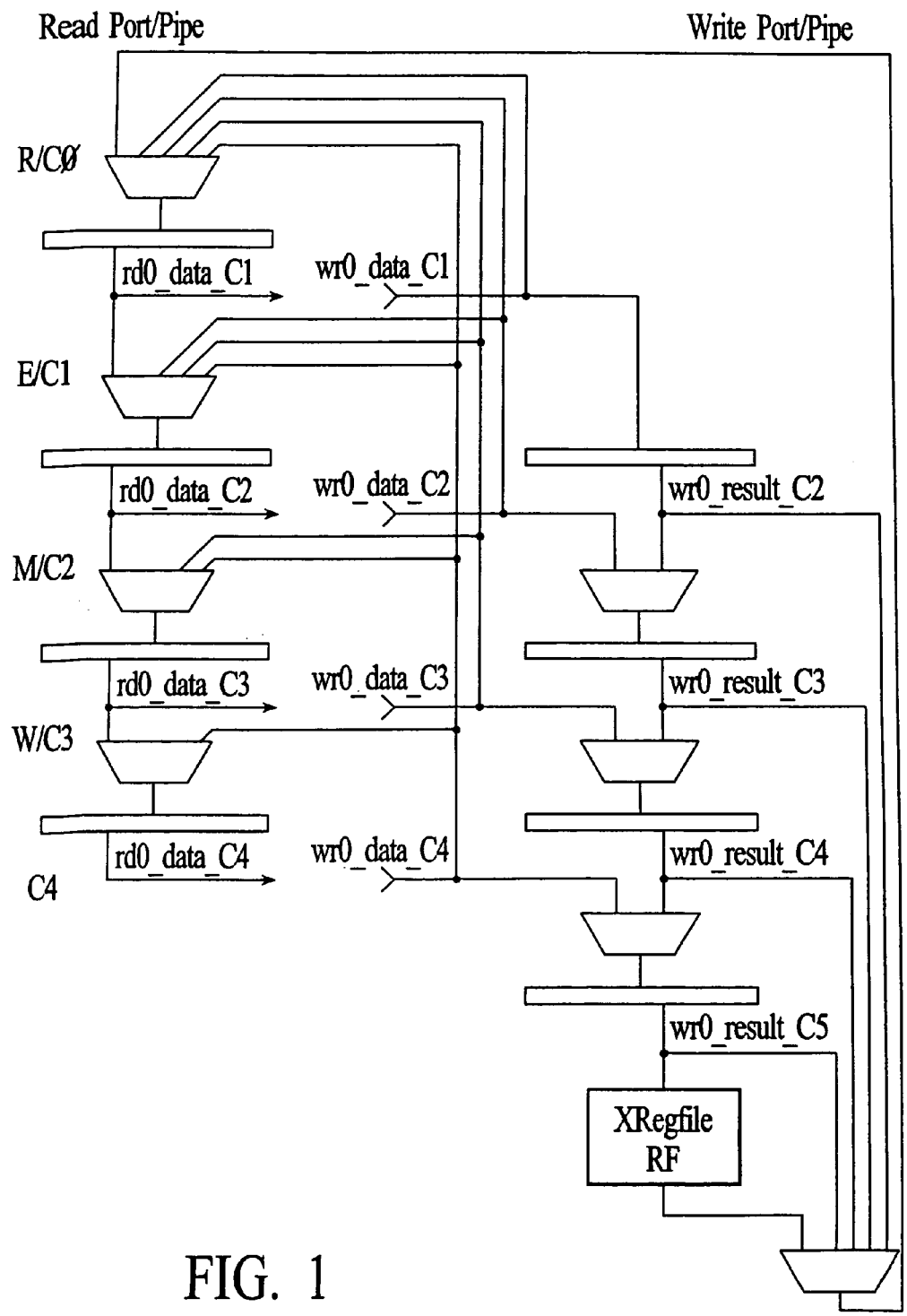
FIGS. 1 and 2 show control logic associated with a four-stage pipelined extensible register according to a preferred embodiment of the present invention.

The present invention to a degree builds upon the technology described in the Killian et al. and Wilson et al. applications in which the Tensilica Instruction Set Extension (TIE) language and its compiler and other tools are described. A preferred embodiment of the present invention extends the TIE language with new constructs and augmented software tools such as compilers and the like which support these constructs.

Extended Register Files

One type of new functionality provided by the preferred embodiment is support for register files. In existing processor art, a register file is a set of N storage locations of B bits each. A field in an instruction selects members of this set as source operand values or destination operand values for the results of the instruction. Typically a register file is designed to support the reading of R of the N members in parallel, and the writing of W of N members in parallel, so that instructions can have one or more source operands and one or more destination operands and still require only one cycle for register file access.

The TIE language construct for declaring a new register file is regfile<rfname><eltwidth><entries><shortname> where <rfname> is a handle used to refer to the register file in subsequent TIE constructs;

<eltwidth> is the width in bits of a register file element ("register");

<entries> is the number of elements in the register file; and

<shortname> is a short prefix (often a single letter) used to create register names for the assembly language. Register names are <shortname> with the register number appended.

The regfile construct does not declare the number of read or write ports; such physical implementation details are left to the TIE compiler as will be described in greater detail below, thereby keeping TIE as implementation-independent as possible and maintaining TIE as a high-level specification description.

As a result of the regfile declaration, the generated processor will include an additional <eltwidth>*<entries> bits of programmer-visible state along with logic to read and write multiple <eltwidth> values of this state. The logic generation algorithm will be described in greater detail below after other relevant TIE language constructs are described.

The TIE construct operand <oname><fieldname>{<rfname>[<fieldname>]} declares <oname> as a handle for reading or writing register file <rfname> elements designated by field <filedname> of the instruction word. This construct is the same as described in the Killian et al. application, except that <rfname> may designate a register file declared with regfile in addition to the core register file (named "AR"). As described in the Killian et al. application, the <oname> handle is then usable in iclass declarations to describe register file in, out, and inout operands in instructions.

```
opcode    GFADD8     op2=4'b0000 CUST0
opcode    GFMULX8    op2=4'b0001 CUST0
opcode    GFRWMOD8 op2=4'b0010         CUST0
state gfmod 8
user_register 0 { gfmod }
regfile gf 8 16 g
operand gr r { gf[r] }
operand gs s { gf[s] }
operand gt t { gf[t] }
iclass gfrrr { GFADD8 } {out gr, in gs, in gt} { } { }
iclass gfrr { GFMULX8 } {out gr, in gs} {in gfmod} { }
iclass gfr { GFRWMOD8 } {inout gt} {inout gfmod} { }
semantic gf1 { GFADD8 } {
    assign gr = gs ˆ gt;}
semantic gf2 { GFMULX8 } {
    assign gr = gs[7] ? ({gs[6:0],1'b0} ˆ gfmod) : {gs[6:0],1'b0};
}
semantic gf3 { GFRWMOD8 } {
    wire [7:0] t1 = gt;
    wire [7:0] t2 = gfmod,
    assign gfmod = t1;
    assign gt = t2;
}
``` implements a simplified Galois-field arithmetic unit on an 8-bit data value (an entire set of TIE files for implementing this example may be found in Appendix A). A 16-entry, 8-bit register file is created (each register holds a polynomial over GF(2) modulo the polynomial stored in gfmod), and two instructions are defined that operate on these registers. GFADD8 adds the polynomial in the register specified by the s field of the instruction word (the "gs register") to the polynomial in the register specified by the t field of the instruction word (the "gt register"), and writes the result to the register specified by the r field of the instruction word (the "gr register"). GFMULX8 multiplies the polynomial in the gs register by x modulo gfmod and writes the result to the gr register. GFRWMOD8 is for reading and writing the gfmod polynomial register.

The logic generated from this simple TIE code is more complicated as it requires control logic to handle the assignment of various operations to different pipeline stages. TIE is a high-level specification that describes instruction sets at a level familiar to users of instruction sets, and not as low-level as written by implementers of instruction sets (i.e., processor designers).

An example of register pipeline control logic generated by the TIE code is shown in FIG. 1. This shows a four stage pipelined register which includes on the left side of the Figure a read data pipe formed by four pipeline registers and their corresponding input multiplexers. Starting from the top, each pair of pipeline registers in the read port delineate the boundaries of the C0 (R), C1 (E), C2 (M), C3 (W) and C4 pipeline stages. The output of each pipeline register, rd0_dataC1-rd0_dataC4, is provided to the register's datapath interposed between the read and write ports (not shown for simplicity). These outputs, as well as outputs of all later pipeline registers in the read port, are provided as inputs to the next stage multiplexer. Control signal generation for the read port multiplexers is described in detail below.

The Figure also shows a write port on the right side of the Figure formed by four pipeline registers and corresponding input multiplexers for the three latest pipeline stages therein. Four signals w0_dataC1-w0_dataC4 from the register datapath are provided to inputs of corresponding ones of the write port register inputs either directly or via multiplexing with an output wr0-resultC2-wr0_resultC4 of the previous write port pipeline register. These output signals are multiplexed along with the output of the register file xregfle RF and fed to the C0 stage multiplexer of the read port pipeline.

Control signals for the multiplexers in the read and write ports are generated along with a write enable for xregfile RF and a stall signal stall_R using the circuitry of FIG. 2 as will be readily apparent to those skilled in the art when read in conjunction with the discussion of compiler generation of register files below.

Figure 2:
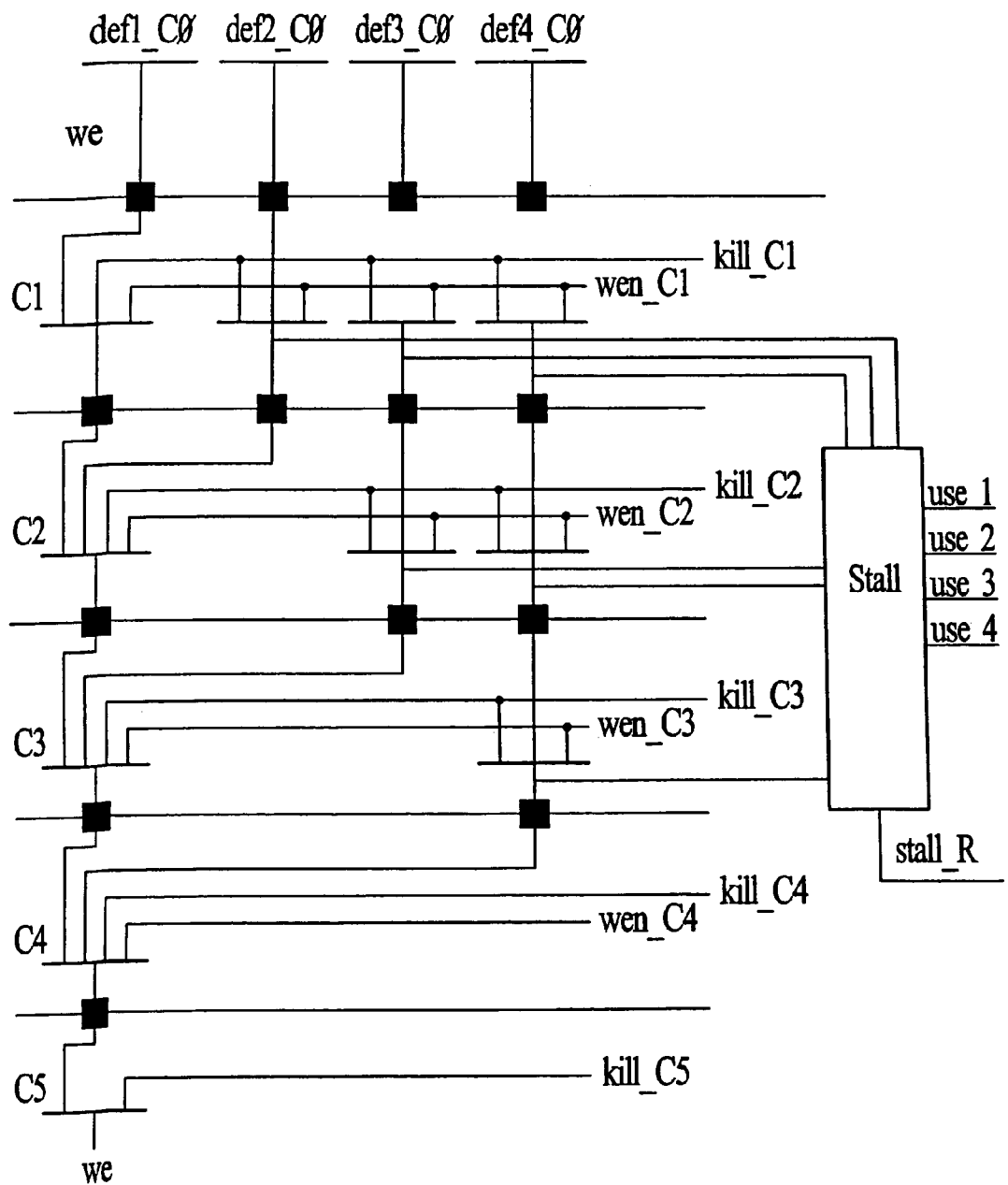
Figure 3:
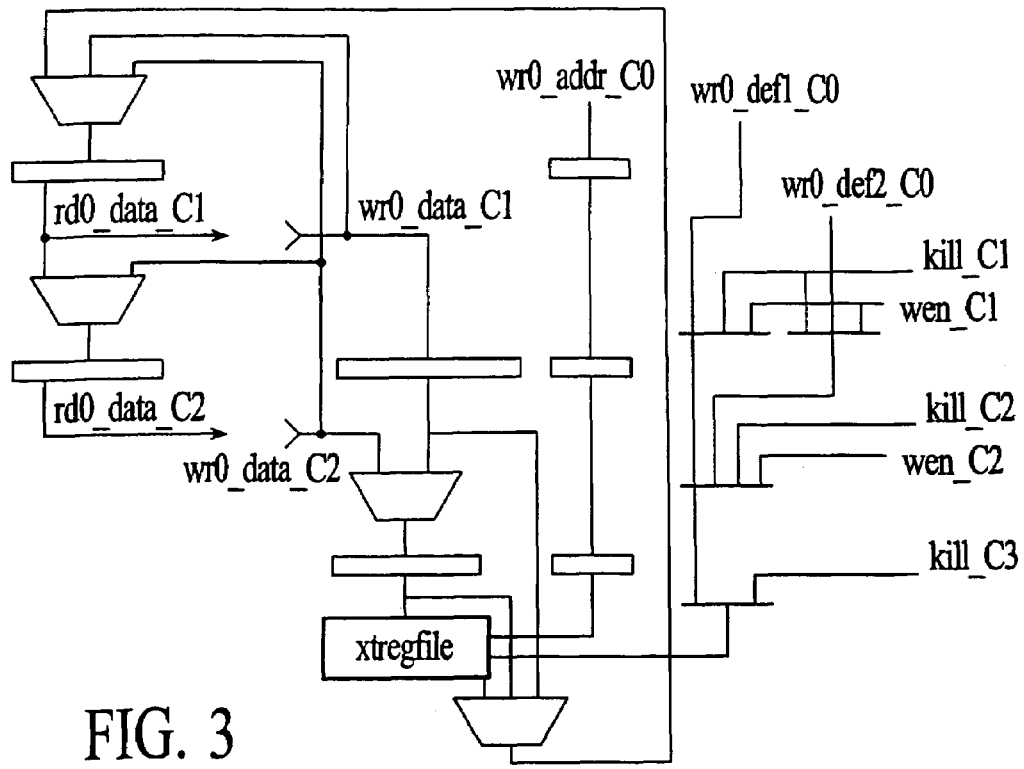
FIG. 3 shows a two-stage pipelined version of the register of FIGS. 1 and 2.

For ease of understanding, a two-stage register file combining the two-stage versions of the circuits of FIGS. 1 and 2 is shown in FIG. 3.

Generating Register Files

For each register file declared by a regfile statement, the compiler must produce:
the register file storage cells;
the read ports;
the write ports;
source operand interlock logic;
source operand bypass logic; and
destination operand write logic.

Read and Write Ports

The first steps in generating a register file are to determine the number of read and write ports, assign pipeline stages to the ports, and assign operands to the ports. Many algorithms could be used to do these operations, each resulting in different speed and area tradeoffs. The following algorithm is used in the preferred embodiment.

For each field used to select a source operand from the register file, a read port is generated. In some cases this will generate more read ports than necessary, but it generally produces a faster register read because it allows the register reads to begin in parallel with instruction decode. Consider the previous Galois-field arithmetic example where iclass gfr {GFRWMOD8} {inout gt} {inout gfmod} { } has been changed to iclass gfr {GFRWMOD8} {inout gr} {inout gfmod}{ }

The above algorithm will generate three register read ports (one each for the r, s, and t fields of the instruction word), even though no instruction uses more than two GF register file reads at the same time. However, if only two read ports are generated, then it is necessary to have a 2:1 mux in front of one of the read ports to select between the r and s fields or between the r and t fields. This mux must be controlled by decode logic that distinguishes the GFRWMOD and GFADD instructions. In a complicated example, the logic could be substantial, making the register file read take much longer.

The extra area required by the algorithm used in the preferred embodiment can generally be avoided by the instruction set designer arranging the register file access fields of instructions such that the number of different fields used to read each register file is equal to the largest number of reads used by any instruction. This is why operand gt is used instead of gr in the iclass gfr in the above example.

A possible enhancement to the above algorithm is to track the minimum stage number specified in a schedule statement (explained in greater detail in the "Multi-Cycle Instructions in TIE" section below) for each field. If the minimum stage number is greater than the stage number in which instruction decode is performed, then muxing of fields may be used to reduce the number of read ports. For all fields where the minimum stage number is in the instruction decode stage, a separate port for each field used to read the register file is used.

Consider the following example:

```
regfile SR 32 4 r
operand sx x { SR[x] }
operand sy y { SR[y] }
operand sz z { SR[z] }
operand su u { SR[u] }
operand sv v { SR[v] }
iclass stu {inst1} {out sz, in sx, in sy, in su}
iclass stv {inst2} {out sz, in sx, in sy, in sv}
schedule stu {inst1} {
  in sx 1;
  in sy 1;
  in su 2;
  out sz 2;
}
schedule stv {inst2} {
  in sx 1;
  in sy 1;
  in sv 2;
  out sz 2;
}
``` where there are four input operands of the register file SR: sx, sy, su, and sv. According to the schedule information, su and sv are both used in the second pipeline stage and therefore can be mapped to a single read port without impacting the cycle time. Consequently, there is no need to create four read ports of the SR register file. In this case, let the address signals of the three read ports be: read_addr_0, read_addr_1, and read_addr_2, then the logic for the three addresses will be read_addr_0=x;
read_addr_1=y;
read_addr_2=inst1 ? u:v;

Write ports are less time-critical. Even a very short pipeline would read the register file in cycle 0, perform a calculation in cycle 1, and write the register file in cycle 2. Thus there is plenty of time in which to decode and mux between all the fields used to write the register file. A more critical timing path is interlocking; after reading the register file in cycle 0, it is necessary to know what register file is being written at the beginning of cycle 1 so that a following instruction reading the register file can be stalled if necessary. However, generally one cycle is sufficient time in which to decode and mux the destination register fields, and so this algorithm saves area without affecting speed.

The interface of the register file read and write ports to the processor pipeline will vary according to the core processor's pipeline architecture. In the preferred embodiment, the core processor's pipeline always uses the read and write ports in a fixed pipeline stage as shown in U.S. patent application Ser. No. 09/192,395 to Dixit et al. and Ser. No. 09/322,735 to Killian et al., both of which are hereby incorporated by reference, where the read ports are always used before the first stage and the write ports after the last (fourth) stage in a four-stage pipelined register file.

Each read port will be read in the earliest stage of any instruction that uses it as a source operand; instructions that use such operands in later stages read the register file early and stage the data along to the specified stage. This staging also includes bypass muxes so that instructions that produce the desired element after the register file is read are still available. For write ports, the write occurs in the latest stage of any instruction that uses it as a destination operand of in the instruction commit stage, e.g., the W stage, if that stage comes later. FIG. 1 shows the logic schema for register file read and write ports in the preferred embodiment.

Bypass Logic

The bypass logic is illustrated in FIG. 1 and is accomplished by the mux's on the read-port logic. For example, if an instruction produces a result in stage 3 (wr0_data_C3) and a subsequent instruction needs to use the data in stage 1, the control signals to the first mux on the read-port logic will be set such that the fourth input from the left will be selected. Consequently, in the next clock cycle, the data (rd0_data_C1) is available for the instruction.

Interlock Logic

The interlock logic is illustrated in FIG. 2. Based on the schedule information, the instruction decoding logic generates a defN for each read port and an useN signal for each write port for the instruction about to be issued. useN indicates that the instruction will need its input register operand in stage N. defN indicates that the instruction will produce its result in stage N. Furthermore, the defN signal for an instruction is piped along with the instruction in the pipeline. The stall signal is generated by examining the combination of all the defN' S and useN's signals. The following example illustrated the stall logic for a 4-stage pipelined register file with two read ports (rd0 and rd1) and one write port (wd0). The suffix in the signal name (_Cn) indicates that the signal exists in stage n of the pipeline.

Thus,
assign Stall_R =
((wr0_addr_C1 == rd0_addr_C0) & (
(rd0_use1_C0 & (wr0_def2_C1 | wr0_ns_def3_C1 | wr0_ns_def4_C1)) |
(rd0_use2_C0 & (wr0_def3_C1 | wr0_ns_def4_C1)) |
(rd0_use3_C0 & (wr0_def4_C1)))) |
((wr0_addr_C2 == rd0_addr_C0) & (
(rd0_use1_C0 & (wr0_def3_C2 | wr0_ns_def4_C2)) |
(rd0_use2_C0 & (wr0_def4_C2)))) |
((wr0_addr_C3 == rd0_addr_C0) & ( -continued

```
(rd0_use1_C0 & (wr0_def4_C3)))) |
((wr0_addr_C1 == rd1_addr_C0) & (
(rd1_use1_C0 & (wr0_def2_C1 | wr0_ns_def3_C1 | wr0_ns_def4_C1)) |
(rd1_use2_C0 & (wr0_def3_C1 | wr0_ns_def4_C1)) |
(rd1_use3_C0 & (wr0_def4_C1)))) |
((wr0_addr_C2 == rd1_addr_C0) & (
(rd1_use1_C0 & (wr0_def3_C2 | wr0_ns_def4_C2)) |
(rd1_use2_C0 & (wr0_def4_C2)))) |
((wr0_addr_C3 == rd1_addr_C0) & (
(rd1_use1_C0 & (wr0_def4_C3))));
```

The following perl code is used in the preferred embodiment to develop stall codes. wfield( ) and rfield( ) are functions to construct a signal name from a simple signal name, a port name, and a stage number. The expression is written in an efficient factored form.

```
print "      assign Stall_R =\n";
foreach $write_port (@{$rf->{WRITE_PORT}}) {
    foreach $read_port (@{$rf->{READ_PORT}}) {
        for($s = 1; $s <= $write_port->{MAX_DEF}-1; $s++) {
            my($waddr) = wfield("addr", $write_port, $s);
            my($raddr) = rfield("addr", $read_port, 0);
            print "          (($waddr == $raddr) & (\n";
            for($i = 1; $i <= $write_port->{MAX_DEF} - $s; $i++) {
                my($use) = rfield("use$i", $read_port, 0);
                print "            ($use & (";
                for($j = $i+$s; $j <= $write_port->{MAX_DEF}; $j++) {
                    my($ns_def) = wfield("ns_def$j", $write_port, $s);
                    print "$ns_def";
                    if ($j != $write_port->{MAX_DEF}) {
                        print " | ";
                    }
                }
                print "))";
                if ($i == $write_port->{MAX_DEF} - $s) {
                    print ")) |\n";
                } else {
                    print " |\n";
                }
            }
        }
    }
}
print "          1'b0;\n";
print "\n";
```

Write Logic

Because write port addresses are muxed in the preferred embodiment to reduce the hardware cost associated with each write port, it becomes necessary to have an algorithm for determining which operands use which ports. One criteria for this muxing is to minimize the logic required. In the target pipeline, the primary logic cost is that of staging data to the write port stages. If all writes occur in the same pipeline stage, there is no difference in this logic cost, but if writes occur in multiple stages, logic may be saved by grouping together destination operands with similar write stages.

Consider the following example:

```
regfile SR 32 8 s
    operand sx x { SR[x] }
    operand sy y { SR[y] }
    operand sz z { SR[z] }
    operand su u { SR[u] }
    operand sv v { SR[v] }
```

-continued

```
    iclass i1 {inst1} {out sx, out sy, in su, in sv}
    iclass i2 {inst2} {out sz, in su, in sv}
    schedule s1 {inst1} {
        out sx 8;
        out sy 3;
    }
    schedule s2 {inst2} {
        out sz 9;
    }
```

Here, inst1 produces two results for SR, one in 3 cycles and the other in 8 cycles. inst2 produces one result for SR in 9 cycles. Since inst1 needs two write ports and inst2 needs one write port, register file SR only needs to have two write ports. Let the ports be wr0 and wr1. For inst1, the mapping of operands to write ports is simply sx->wr0
sy->wr1

This implies that wr0 needs to have 8 stages and wr1 3 stages. For inst2, there is a choice of either sz->wr0 or sz->wr1

However, the two choices have different logic cost. Mapping sz to wr0 implies adding one more stage to wr0 (increasing from 8 to 9) and to wr1 implies adding 6 more stages to wr1 (increasing from 3 to 9).

The preferred embodiment uses the following algorithm. For each instruction, sort the operands by stage number in descending order and assign them to sequentially to write port 0 to write port n−1. Thus the write port 0 will have the longest data chains and the write port n−1 the shortest. For instructions with m operands where m is less than n, the operands will be mapped to the first m write ports in the similar descending order by the stage numbers. The following example is used to illustrate the write-port assignment process:

```
regfile SR 32 8 s
    operand sx x { SR[x] }
    operand sy y { SR[y] }
    operand sz z { SR[z] }
    operand su u { SR[u] }
    operand sv v { SR[v] }
    operand sw w { SR[w] }
    iclass i1 {inst1} {out sx, out sy, in su, in sv}
    iclass i2 {inst2} {out sz, in su, in sv}
    iclass i3 {inst3} {out sw, in su, in sv}
    schedule s1 {inst1} {
        out sx 8;
        out sy 3;
    }
```

-continued

```
schedule s2 {inst2} {
  out sz 9;
}
schedule s3 {inst3} {
  out sw 2;
}
```

This process would yield the following assignments: for inst1,
sx->wr0
sy->wr1
for inst2,
sz->wr0
for inst3,
sw->wr0

Even though the above write-port assignment procedure minimizes the data staging cost, it can be further refined to optimize other cost criteria such as power consumption. In the above example, sw of inst3 can be mapped to wr1 without increasing the staging cost at all. However, by doing so provided opportunity to power-down the pipeline after the data is written into the register SR at the end of stage 2.

Assigning sw to wr0 would require the pipeline to be active for 9 cycles. The following procedure can be used as the second pass to further improve the write-port assignment for additional cost considerations such as power consumption.

For each instruction with m operands where m<n and for each operand in the reverse order, move the assignment of the operand to a new write port i where i is as large as possible without increasing the staging cost. To illustrate this procedure using the previous example, no operands of inst1 can be moved because it already uses all the write ports. For inst2, sz can not be re-assigned to wr1 without increasing the staging cost. For inst3, sw can be re-assigned from wr0 to wr1 without increasing the staging cost.

Many variations on the algorithms for assignment of register file read and write ports are possible. For example, in some circumstances it may be appropriate to provide more ports than strictly required to minimize data staging to consume less power. It is also possible to provide fewer ports than required by some instructions to further reduce the hardware cost associated with read and write ports; for read ports this would mean taking multiple cycles to read the register operands, and for write ports this would mean buffering some register writes to wait for a cycle where a write port is unused. Another possibility is to allow the TIE code to specify the register file read and write port assignments to handle cases for which the automatic algorithms give undesirable results.

The above concepts of extended register implementation are used in the code of Appendix B, a perl program which generates an N-read, M-write B-bit S-entry register file.

Load/Store Instructions

As described in Background of the Related Art, TIE load and store instructions are required to provide a means for transferring data to and from TIE register files directly to memory. So they must, by this requirement, share the local memories of the memory (M) stage of the core pipeline, i.e., data cache, Data RAM, Data ROM, etc. In addition to sharing the local memory, it is desirable to share as far as is possible other hardware resources used in core load/store. Sharing of resources yields a more optimum solution in terms of area and timing. As will be described below, the address computation logic and the data alignment logic are two sets of resources that are shared between core and TIE load/store.

The following interface signals are required to implement TIE load/store in the preferred embodiment.

| interface VaddrOffset | 32 | core | out |
|---|---|---|---|
| interface VaddrBase | 32 | core | out |
| interface VaddrIndex | 32 | core | out |
| interface LSIndexed | 1 | core | out |
| interface LSSize | 5 | core | out |
| interface MemDataOut<n> | <n> | core | out |
| interface VaddrIn | 32 | core | in |
| interface MemDataIn<n> | <n> | core | in |

Figure 4:
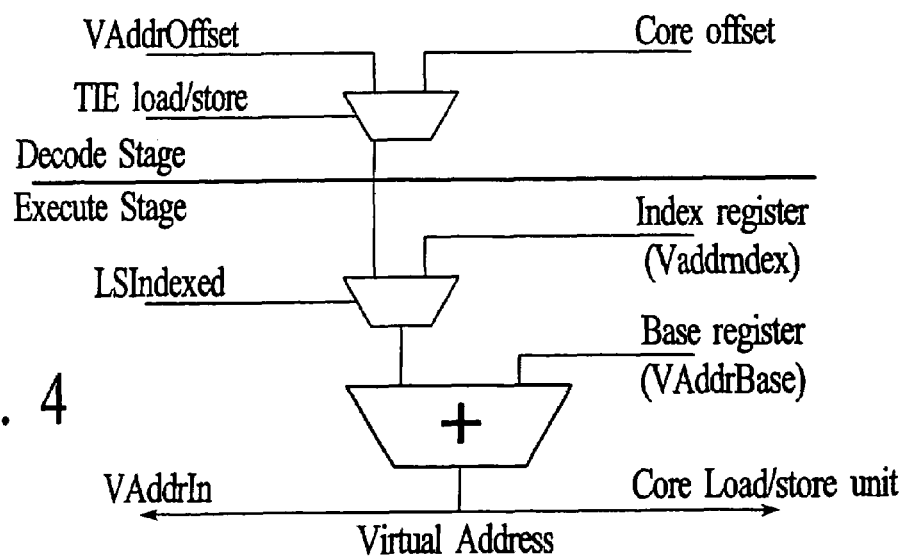
FIG. 4 shows interface signals to a core adder according to the first embodiment.
Figure 6:
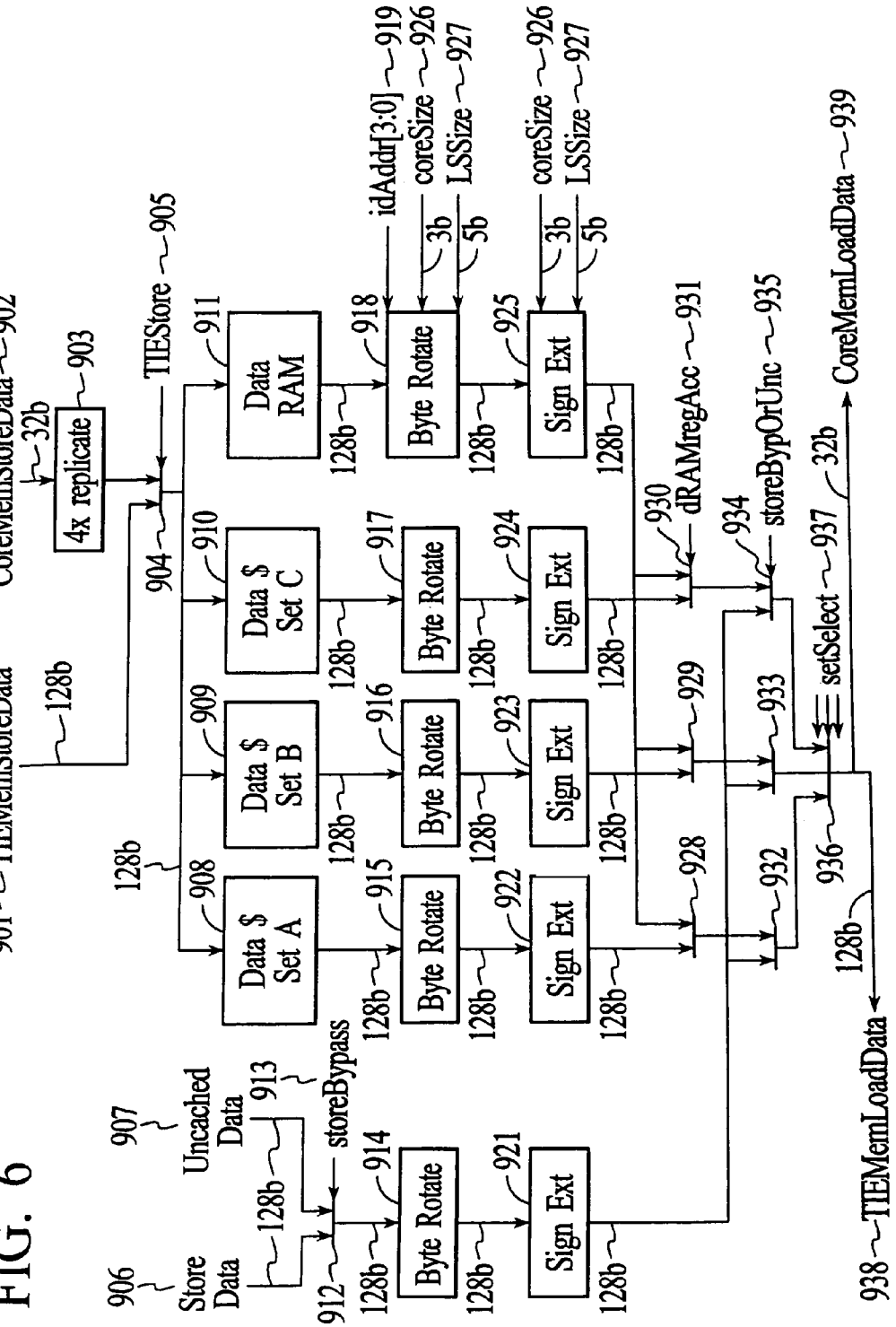

Most of these signals are illustrated in FIG. 4; FIG. 6 shows LSSize 927, MemDataOut<n> 901 and MemDataIn<n> 938. LSSize gives the size of the data reference in bytes (1, 2, 4, 8, or 16 in the preferred embodiment). MemDataOut<n> provides store data from the TIE semantics to the core, and MemDataIn<n> provides load data from the core to the TIE semantics. In the preferred embodiment <n> may be 8, 16, 32, 64, or 128.

In computing the memory address of the TIE load/store, it is possible to share the address adder in cases where the format of the TIE load and store instructions match that of the core. Duplicating the address adder would be wasteful and introduces additional delay in the address calculation path. The interface signals represent inputs to the core address adder as shown in FIG. 4. This address logic is intended for supporting the addressing modes I AR[s]+immediate
X AR[s]+AR[t]

The selection between the two modes is made by the LS Indexed interface signal. The immediate used by the I-form is provided on the VAddroffset input, and the AR[t] value used by the X-form is provided on the VAddrIndex input. VaddrBase is used to provide AR [s]. While other values than AR [s] and AR [t] could be provided on VAddrBase and VAddrIndex by TIE semantic blocks, providing these values allows logic optimization to significantly simplify the resulting logic, and thus keeps the address generation from being timing-critical. This is because the logic optimization would recognize that the VaddrBase (AR [s]) from TIE logic is the same as the base address of the core and reduces it to the same signal.

TIE can benefit from the load and store alignment logic in the core—given certain modifications to this logic. Because alignment requires a large amount of logic to implement, avoiding replication for TIE provides a significant area savings. Moreover, replication could introduce timing critical paths due to the heavy loading it compels the local memory outputs and alignment and data select control signals to drive. In order to implement sharing of the alignment resources though, the modifications exemplified in FIGS. 5 and 6 are required.

These modifications firstly relate to the fact that TIE load/store requires/provides multiple load/store widths as opposed to the 32 bits of core load/store. This means that all the data paths within the alignment logic must increase in width to match the maximum of the TIE or core data width. Secondly, TIE load could require a more general alignment function as opposed to the simple right shift required by the core. This means that the alignment logic must perform a superset of the TIE alignment function and the core right shift.

Figure 5:
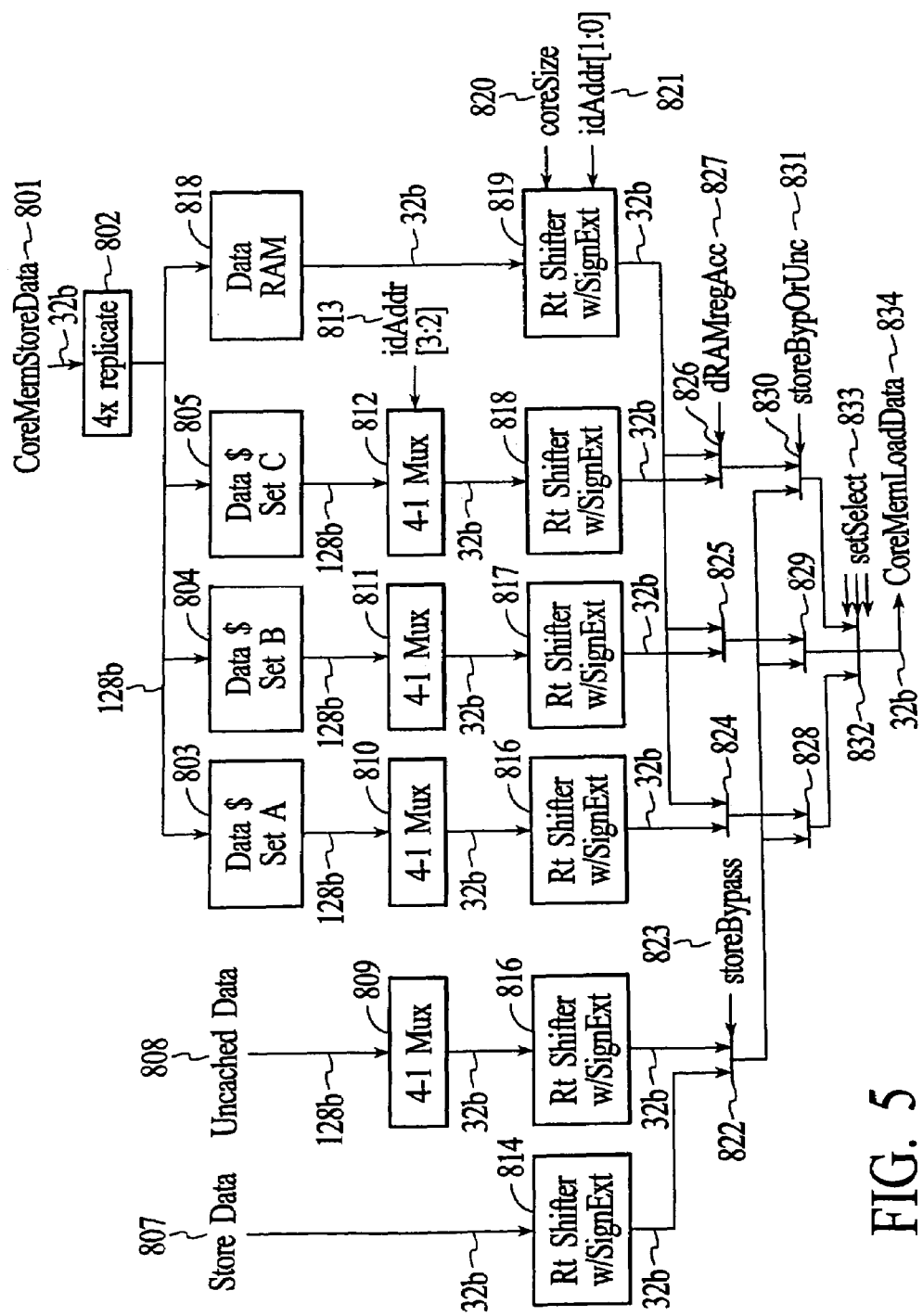
FIG. 5 shows a prior load aligner and FIG. 6 shows a load aligner according to the preferred embodiment.

FIG. 5 shows prior art core load alignment logic for a three-way set associative data cache 803-805 of 128-bit access width and a parallel data RAM 806. In this example, the uncached data input 808 is also chosen to be 128 bits wide for cache refill convenience, and the data RAM access is 32 bits wide because it is accessed only through core load/stores whose maximum width is 32 bits. There is also a 32 bit wide store data input 807 used when stored data must be bypassed to a subsequent load.

The primary alignment mechanism used is the 4:1 multiplexer 809-812 followed by a byte-level right shift that also does sign extension 814-819. The amount of the shift is given by the load address 813, 821 and the one-hot decoded coreSize signal 820. The store and data RAM data do not require the 4:1 multiplexer because they are already 32 bits wide. The 32 bit wide aligned data is then selected by a series of subsequent multiplexers 822-833 to yield the final core load data 834.

FIG. 6 shows an example of load alignment implementation in this embodiment. The primary difference is that all the load data sources 906-911 are now 128 bits wide to support 128 bit-wide TIE load instructions, and the load alignment result is also 128 bits wide. In this example, the alignment itself is done using a byte-level rotator 914-918 followed by a sign extender 921-925. A byte-level rotator is required because in this example the TIE semantics happen to call for data rotation (again, in addition to the simple right shift required by the core load alignment). The amount of the shift or rotate is given by the load address 919 and the one-hot decoded LSSize 927 or coreSize 926 signal. The final output of the load alignment could be used either by the TIE coprocessor—the entire 128-bit width 938 providing all the multiple load widths as specified by LSSize; or by the core—only the least significant 32-bit portion 939 providing the three core load widths 32/16/8-bit as specified by coreSize.

The core provides the virtual address back to the semantic block in addition to the memory data. The virtual address is sometimes needed for additional processing on the load data. In addition, this allows load and store instructions to be defined that modify the registers used to form the virtual address. For example, the "update" modes of the core ISA do

```
IU      vAddr <- AR[s] + offset
        AR[s] <- vAddr
XU      vAddr <- AR[s] + AR[t]
        AR[s] <- vAddr
```

The bundled write to the base address register AR [s] avoids a separate increment instruction in many inner loops. This is accomplished in TIE as simply as changing "in" to "inout" and adding an assignment.

To understand the benefit of a bundled write to the base address register, first consider a software loop which does not use this feature:

```
for (i = 0; i < n; i++) {
    x = tie_loadi(px, 0);
    y = tie_loadi(py, 0);
    z = inst1(x, y);
    tie_storei(z, pz, 0);
    px = px + 8;
    py = py + 8;
    pz = pz + 8;
}
```

This example loops over two input arrays (px and py) in which the elements are 8 bytes wide, performs a computation (inst1), and stores the result in another array (p z). Three out of seven instructions in this loop were used to advance the base pointers for the load and store instructions. Using the bundled write load and store instructions, the example would be made much more efficient as illustrated in the following code:

```
px = px - 8;
py = py - 8;
pz = pz - 8;
for (i = 0; i < n; i++) {
    x = tie_loadiu(px, 8);
    y = tie_loadiu(py, 8);
    z = inst1(x, y);
    tie_storeiu(z, pz, 8);
}
```

Now, tie_loadiu (tie_storeiu) will calculate the virtual address as p+8, load (store) the memory data, and change p to p+8 in one instruction. The initial subtractions are needed to correct px, py, and pz because the first now begins at px+8, py+8 and first store at px+8.

The stage numbers of core signals, such as the load/store interface described here, are fixed by the core pipeline, and are not specified in the schedule declarations. The appropriate values are used, however, in the pipeline insertion algorithm described above. For example, the following adds load and store instructions to the Galois-field arithmetic GF unit example above:

```
opcode   LGF8.I     r=4'b0000      LSCI
opcode   SGF8.I     r=4'b0001      LSCI
opcode   LGF8.IU    r=4'b0010      LSCI
opcode   SGF8.IU    r=4'b0011      LSCI
opcode   LGF8.X     op2=4'b0000    LSCX
opcode   SGF8.X     op2=4'b0001    LSCX
opcode   LGF8.XU    op2=4'b0010    LSCX
opcode   SGF8.XU    op2=4'b0011    LSCX
interface VaddrOffset   32   core   out
interface VaddrBase          32   core   out
interface VaddrIndex    32   core   out
interface LSIndexed      1         core   out
interface LSSize         5   core   out
interface MemDataIn8     8   core   in
interface VaddrIn       32   core   in
interface MemDataOut8    8   core   out
iclass gfloadi { LGF8.I } { out gt, in ars, in imm8} { } {
    out LSSize, out LSIndexed, out VAddrOffset, out VAddrBase, in MemDataIn8 }
iclass gfstorei { SGF8.I } { in gt, in ars, in imm8} { } {
    out LSSize, out LSIndexed, out VAddrOffset, out VAddrBase, out MemDataOut8 }
iclass gfloadiu { LGF8.IU } { out gt, inout ars, in imm8} { } {
    out LSSize, out LSIndexed, out VAddrOffset, out VAddrBase, in MemDataIn8, in VAddrIn }
iclass gfstoreiu { SGF8.IU } { in gt, inout ars, in imm8} { } {
    out LSSize, out LSIndexed, out VAddrOffset, out VAddrBase, out MemDataOut8, in VAddrIn }
iclass gfloadx { LGF8.X } { out gr, in ars, in art} { } {
    out LSSize, out LSIndexed, out VAddrIndex, out VAddrBase, in MemDataIn8 }
iclass gfstorex { SGF8.X } { in gr, in ars, in art} { } {
    out LSSize, out LSIndexed, out VAddrIndex, out VAddrBase, out MemDataOut8 }
iclass gfloadxu { LGF8.XU } { out gr, inout ars, in art} { } {
    out LSSize, out LSIndexed, out VAddrIndex, out VAddrBase, in MemDataIn8, in VAddrIn }
iclass gfstorexu { SGF8.XU } { in gr, inout ars, in art} { } {
    out LSSize, out LSIndexed, out VAddrIndex, out VAddrBase, out MemDataOut8, in VAddrIn }
semantic lgf { LGF8.I, LGF8.IU, LGF8.X, LGF8.XU } {
    assign LSIndexed = LGF8.X|LGF8.XU;
    assign LSSize = 1;
    assign VAddrBase = ars;
    assign VAddrIndex = art;
    assign VAddrOffset = imm8;
```

-continued

```
      assign gt = MemDataIn8;
      assign gr = MemDataIn8;
      assign ars = VAddrIn;
   }
   semantic sgf { SGF8.I, SGF8.IU, SGF8.X, SGF8.XU } {
      assign LSIndexed = SGF8.X|SGF8.XU;
      assign LSSize = 1;
      assign VAddrBase = ars;
      assign VAddrIndex = art;
      assign VAddrOffset = imm8;
      assign MemDataOut8 = SGF8.X|SGF8.XU ? gr : gt;
      assign ars = VAddrIn;
   }
   schedule gfload { LGF8.I }
   {
      use imm8 0;
      use ars 1;
      def gt 2;
   }
   schedule gfloadu { LGF8.IU }
   {
      use imm8 0;
      use ars 1;
      def ars 1;
      def gt 2;
   }
   schedule gfloadx { LGF8.X }
   {
      use ars 1;
      use art 1;
      def gr 2;
   }
   schedule gfloadxu { LGF8.XU }
   {
      use ars 1;
      use art 1;
      def art 1;
      def gr 2;
   }
```

Here is a tpp input for producing a load aligner for the invention:

```
module loadalign (out, in, va, vamask, TIEload, L16SI, L16UI, L8UI);
; use Utilities;
; my $bits = $pr->dcache->accessBits;
; my $bytes = $bits >> 3;
; my $mux = log2($bytes);
   output out['$bits-1':0];
   input in['$bits-1':0];
   input va['$mux-1':0];
   input vamask['$mux-1':0];
   input TIEload;
   input L16SI;
   input L16UI;
   input L8UI;
   wire L8or16 = L8UI|L16UI|L16SI;
   wire vam['$mux-1':0] = TIEload
            ? va & vamask
            : {va['$mux-1':2],va[1]&L8or16,va[0]&L8UI};
; sub rot {
;    my ($bits, $n, $step, $in, $out, $sel) = @_;
;    my @muxin = map($_ == 0
;          ? $in
;          : '{'.$in.'['.($_*$step-1).':0],'.$in.'['.($bits-
1).':'.($_*$step).']}',
;          0..($n-1));
   xtmux'$n'e #'$bits' ('$out',
       ' join(",\n\t\t", @muxin) ',
       '$sel');
; }
; my $in = 'input';
```

```
;   if ($mux & 1) {
;       # rotate is done with 4:1 muxes and one 2:1 mux
;       # combine the last 2:1 mux with the sign extend
;       for (my $i = $mux - 2; $i >= 1; $i -= 2) {
;         my $out = 't'.($temp++);
      wire ['$bits-1':0] '$out';
;         rot($bits, 4, 8 * (1 << $i), $in, $out,
'vam['.($i+1).':'.$i.']');
;         $in = $out;
;      }
;      if ($bits > 32) {
         xtmux2e #'$bits - 32' (output['$bits-1':32],
            '$in'['$bits-1':32],
            {'$in'[7:0],'$in'['$bits-1':40]},
            vam[0]);
;      }
         xtmux4e #16 ( output[31:16],
            '$in'[31:16],
;         if ($bits > 32) {
            '$in'[39:24],
;         } else {
            {'$in'[7:0],'$in'[31:24]},
;         }
            {16{'$in'[15] & L16SI}},
            16'b0,       // should never happen because vam[0]
                         // is forced 0 if L8or16 is set
            {L8or16, vam[0]});
         xtmux4e  #8  (   output[15:8],
            '$in'[15:8],
            '$in'[23:16],
            8'b0,
            8'b0,
            {L8UI,vam[0]});
         xtmux2e  #8  (   output[7:0],
            '$in'[7:0],
            '$in'[15:8],
            vam[0]);
;   } else {
;      # rotate is all done in 4:1 muxes,
;      # so sign extend must be done in separate 2:1
;      for (my $i = $mux - 2; $i >= 0; $i -= 2) {
;         my $out = 't'.($temp++);
      wire ['$bits-1':0] '$out';
;         rot($bits, 4, 8 * (1 << $i), $in, $out,
'vam['.($i+1).':'.$i.']');
;         $in = $out;
;      }
      assign out = {
;         if ($bits > 32) {
            '$in'['$bits-1':32],
;         }
            L8or16 ? {16{'$in'[15] & L16SI}} : '$in'[16:32],
            '$in'[15:8] &~ {8{L8UI}},
            '$in'[7:0] };
;   }
endmodule loadalign
```

Here is the output for width 128:

```
module loadalign (out, in, va, vamask, TIEload, L16SI, L16UI, L8UI);
   output out[127:0];
   input in[127:0];
   input va[3:0];
   input vamask[3:0];
   input TIEload;
   input L16SI;
   input L16UI;
   input L8UI;
   wire L8or16 = L8UI|L16UI|L16SI;
   wire vam[3:0] = TIEload
            ? va & vamask
            : {va[3:2],va[1]&L8or16,va[0]&L8UI};
   wire [127:0] t0;
   xtmux4e #128 (t0,
         input,
```

```
        {input[31:0],input[127:32]},
        {input[63:0],input[127:64]},
        {input[95:0],input[127:96]},
        vam[3:2]);
    wire [127:0] t1;
    xtmux4e #128 (t1,
        t0,
        {t0[7:0],t0[127:8]},
        {t0[15:0],t0[127:16]},
        {t0[23:0],t0[127:24]},
        vam[1:0]);
    assign out = {
        t1[127:32],
        L8or16 ? {16{t1[15] & L16SI}} : t1[16:32],
        t1[15:8] &~ {8{L8UI}},
        t1[7:0] };
endmodule loadalign
```

Here is the output for width 64:

```
module loadalign (out, in, va, vamask, TIEload, L16SI, L16UI, L8UI);
    output out[63:0];
    input in[63:0];
    input va[2:0];
    input vamask[2:0];
    input TIEload;
    input L16SI;
    input L16UI;
    input L8UI;
    wire L8or16 = L8UI|L16UI|L16SI;
    wire vam[2:0] = TIEload
                    ? va & vamask
                    : {va[2:2],va[1]&L8or16,va[0]&L8UI};
    wire [63:0] t0;
    xtmux4e #64 (t0,
        input,
        {input[15:0],input[63:16]},
        {input[31:0],input[63:32]},
        {input[47:0],input[63:48]},
        vam[2:1]);
    xtmux2e #32 (output[63:32],
        t0[63:32],
        {t0[7:0],t0[63:40]},
        vam[0]);
    xtmux4e #16 ( output[31:16],
        t0[31:16],
        t0[39:24]},
        {16{t0[15] & L16SI}},
        16'b0,          // should never happen because vam[0]
                        // is forced 0 if L8or16 is set
        {L8or16, vam[0]});
    xtmux4e #8 ( output[15:8],
        t0[15:8],
        t0[23:16],
        8'b0,
        8'b0,
        {L8UI,vam[0]});
    xtmux2e #8 ( output[7:0],
        t0[7:0],
        t0[15:8],
        vam[0]);
endmodule loadalign
```

Here is the output for width 32:

```
module loadalign (out, in, va, vamask, TIEload, L16SI, L16UI,
    L8UI);
    output out[31:0];
    input in[31:0];
    input va[1:0];
    input vamask[1:0];
    input TIEload;
    input L16SI;
    input L16UI;
    input L8UI;
    wire L8or16 = L8UI|L16UI|L16SI;
    wire vam[1:0] = TIEload
                    ? va & vamask
                    : {va[1:2],va[1]&L8or16,va[0]&L8UI};
    wire [31:0] t0;
    xtmux4e #32 (t0,
        input,
        {input[7:0],input[31:8]},
        {input[15:0],input[31:16]},
        {input[23:0],input[31:24]},
        vam[1:0]);
    assign out = {
        L8or16 ? {16{t0[15] & L16SI}} : t0[16:32],
        t0[15:8] &~ {8{L8UI}},
        t0[7:0] };
endmodule loadalign
```

Interface to Core

Loads are stores are typically processed within the processor pipeline using a data cache or a small data RAM. For both cost and correctness, the new load and store instructions must also use this data cache/RAM to maintain the integrity of the cache/RAM data which is processed by both TIE and core instructions. In prior art systems, instructions added to the core did not share logic with the core. The preferred embodiment provides a mechanism for such sharing.

The TIE construct interface <sname><width><mname>[in|out]

declares a signal <sname> that interfaces to TIE module <mname>. This signal is <width> bits wide, and is either an input or output to this TIE code according to the last parameter. For interfacing to the core, <mname> is core.

The TIE iclass construct is extended to list interface signals used by instructions. Its syntax is

```
iclass <classname>
    { <iname>, ... }
    { <operandspec>, ... }
    { <statespec>, ... }
    { <interfacespec>, ... }
``` where <interfacespec> is either in <sname> or out <sname> where <sname> is either an interface signal name or an exception signal name declared in an exception statement. Exception signal names may only be used as outputs, not as inputs. Likewise, the schedule construct is extended to allow interface signal names to be given pipeline stage numbers using "in" (for inputs) or "out" (for outputs).

Figure 7:
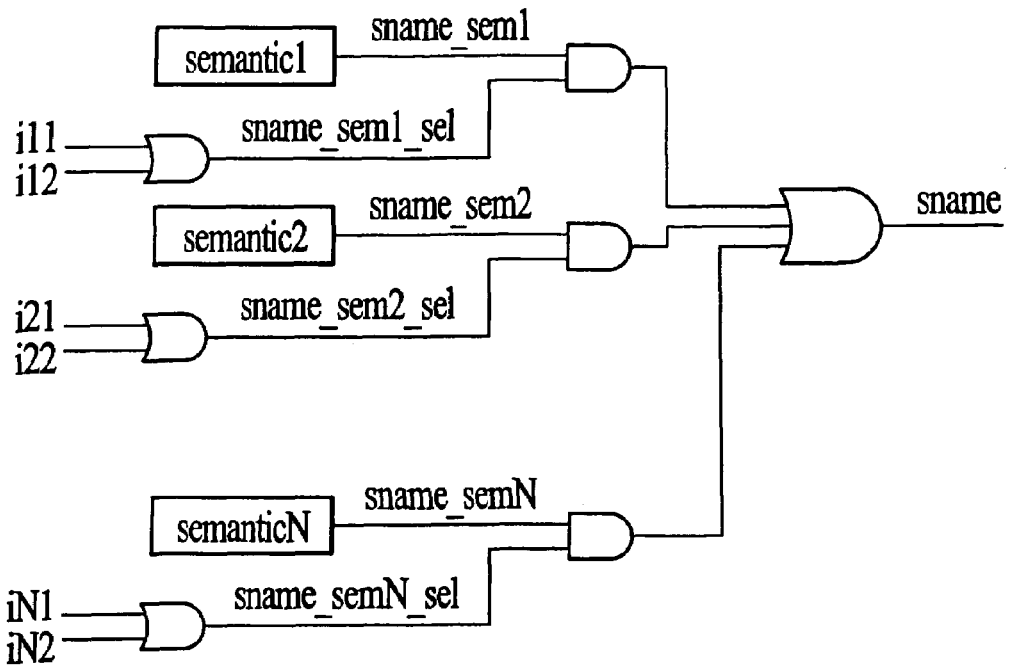
FIG. 7 shows a semantic block output interface signal according to the preferred embodiment.

Each output interface signal from a semantic block is ANDed with the OR of the one-hot instruction decode signals of the instructions with that output listed in the interface section of their iclass. The ANDed interface signals from all the semantic block are then ORed together to form the output signal to the core. FIG. 7 illustrates the implementation of output interface signal sname by the TIE compiler. sname_semI represents the value of sname produced by the i'th semantic block. iN1 and iN2 are one-bit instruction decode signals, and sname_semI_sel is a signal representing the condition under which the i'th semantic produces sname. Each input interface signal is fed directly to the modules which use the signal.

Compiler/OS Support in TIE

So far TIE constructs have allowed state and instructions to be defined, but have not provided any clue on how these instructions should be used automatically by software. In prior systems, all use of the instructions were referenced via intrinsics written into the application; hence, the compiler needed only to map the intrinsics onto instructions and did not need to know how to use the instructions themselves. With the addition of user-definable register files it becomes desirable for the compiler to allocate program variables to elements of the register file. During register allocation, the compiler attempts to assign program values to the registers contained in the register file(s). At certain locations in a program, it may not be possible for all values to be assigned to registers. At these locations, one or more values must be moved to memory. To move a value from a register to memory requires a store, and to move a value from memory to a register requires a load. Thus, at a minimum the compiler must know how to load a value from memory into a register, and how to store a value from a register into memory.

During register allocation, it may also be necessary for the compiler to move a value from one register to another. For example, the value produced by a function may be returned in register A, and the next instruction may require that the value be used from register B. The compiler can move the value from register A to register B by first storing register A to a temporary memory location, and then loading register B from that memory location. However, it is likely to be more efficient to move the value directly from register A to register B. Thus it is desirable, but not required, that the compiler know how to move a value from one register to another.

The save and restore sequences may be more complex than a simple concatenation of the save and restore sequences of the individual registers. In doing the entire register file, there may be opportunity for performance and/or space savings versus the obvious concatenation of the spill instructions. This may also include coprocessor state that is not in a register file.

The state of each coprocessor is composed of a variety of different and potentially interdependent components. The instruction sequence used to save and restore these components may depend on the interdependencies.

This dependency information can be expressed as a graph. If the graph is cyclic, then the state cannot be successfully saved at an arbitrary point in time. But if the dependency graph is acyclic (a DAG) then there is a way to order the save and restore of the components so that all of the coprocessor's state can be saved and restored at an arbitrary point in time.

The TIE compiler uses standard graph construction and analysis algorithms to generate and analyze this dependency information and takes this information into account when generating the save and restore sequence for a given coprocessor.

For example, consider a coprocessor that has two register files, regfile_a and regfile_b. Regfile_a, has four 32 bit registers and regfile_b has sixteen 128 bit values. The additional state is a bitfield of which registers have been touched, called reg_touched, and a push register to back register 0 of regfile_a called reg_back. The coprocessor provides the following load and store instructions to save and restore the coprocessor state:

rur/wur—for access to reg_touched and reg_back
push_a—copies regfile_a register 0 into reg_back
pop_a—copies regfile_a register 0 from reg_back
s128b reg_a_register, reg_b_register—stores the register file regfile_b into the address specified by regfile_a's register l128b reg_a_register, reg_b_register—loads the register file regfile_b from the address specified by regfile_a's register
s32a reg_a_register, reg_a_register—stores the register file regfile_a into the address specified by regfile_a's register
l32a reg_a_register, reg_a_register—loads the register file regfile_a into the address specified by regfile_a's register In this case, the DAG for this save state dependency looks like:

reg_touched <--regfile_a, regfile_b, reg_back because the TIE for this coprocessor makes it so that reg_touched will change anytime regfile_a, regfile_b or reg_back are touched.

regfile_a<----reg_back because the save of the registers in regfile_a requires a free register in regfile_a. To get a free register in regfile_a requires that the register's value be moved through reg_back. This destroys the current value of reg_back.

regfile_a<----regfile_b because the store instructions for regfile_b use a register in regfile_a as the address to which to store. This means that regfile_b can only be stored once regfile_a is already stored—actually only one register in regfile_a. This is glossed over for simplicity of the example.

So the save sequence makes sure that the state is saved in an appropriate order. In this case that order is:

reg_touched, reg_back, regfile_a, regfile_b

In addition, because the preferred embodiment allows the definition of register files whose elements cannot be represented by the built-in types of standard programming languages (e.g., 64+ bits in C or saturating arithmetic as described above), it is necessary to have a mechanism for adding new types to match the defined hardware. Programming language types are also useful for determining to which register files a variable may be allocated.

For example, it is common in many ISAs to map integer values to one register file and floating point values to another because integer computation instructions only take their operands in the integer register file, and floating point instructions only take their operands in the floating point register file. Given the ability to create new data types, it is desirable to have a mechanism to specify allowed conversions between the built-in types and the new types, and between different new types. For example, in the C programming language conversions are allowed between char type variables and short type variables (by sign or zero-extending the char type).

The TIE construct
ctype <tname><size><alignment><rfname> creates a programming language type <tname> and declares it to be <size> bits, aligned on an <alignment> bit boundary in memory, and which is allocated to <rfname>.

For example, continuing with the Galois-field arithmetic GF unit, the statement ctype gf8 8 8 gf declares a new type (for the C programming language in the preferred embodiment) named "gf8" that has 8-bit values aligned on 8-bit memory boundaries, and these values are register allocated to the "gf" register file as needed.

The TIE construct
proto <pname>{<ospec>, . . . } {<tspec>, . . . } {<inst> . . . } is used to specify instruction sequences that perform various functions that the compiler must know about or to give type information about the operands of intrinsics. <ospec> are operand type specifications, <tspec> are temporary register specifications needed by the instruction sequence, and <inst> are the instructions of the sequence.

The syntax of <ospec> is

[in|out|inout]<typename>[*]<oname> where <oname> is an operand name that may be substituted into the instructions (<inst>) of the sequence. <typename> is the type name of the operand (a pointer to that type if the optional asterisk is given).

The syntax of temporary register specification <tspec> is

<rfname><oname> where <oname> is an operand name that may be substituted into the instructions (<inst>) of the sequence. <typename> is a type name that identifies the register file from which <oname> should be temporarily allocated for this sequence.

The syntax of the instructions in the sequence <inst> is

<iname>[<oname>|<literal>], ... ;

where <iname> is the instruction name, <oname> is an operand name declared in either <ospec> or <tspec>, and <literal> is a constant or string that is used unchanged by the compiler when generating the instruction sequence specified by the proto.

One use of proto is simply to associate types with instruction operands for the purpose of defining intrinsics. In this case <pname> is the instruction name; <ospec> matches the iclass operand specification (except that typenames are added); the <tspec> list should be empty; and the <inst> sequence should consist of a single instruction. An example might be:

```
proto GFADD8 {out gf8 r, in gf8 s, in gf8 t} { } {
  GFADD8    r, s, t;
}
```

Another use of proto is to define multi-instruction intrinsics. Here <tspec> may be non-empty. Example:

```
proto GFADDXSQ8 {out gf8 r, in gf8 s} {gf8 tmp} {
  GFMULX8   tmp, s;
  GFMULX8   r, tmp;
}
```

An additional use of proto is to instruct the compiler how to load and store values of programming language types declared using the ctype TIE construct. As discussed earlier, being able to load and store values to and from memory is necessary for the compiler to perform register allocation, and to allow a register file's contents to be saved and restored on a task switch.

For each ctype <tname> declaration, there must be proto declarations of the form

```
proto <tname>_loadi
  { out <tname> <x>,
    in <tname>* <y>,
    in immediate <z> }
  { <tspec>, ... }
{
```

```
  <inst>...   // sequence of instructions that loads
              // register <x> from the address <y>+<z>
}
proto <tname>_storei
  { in <tname> <x>,
    in <tname>* <y>,
    in immediate <z> }
  { <tspec>, ... }
{
  <inst>...   // sequence of instructions that stores
              // register <x> from the address <y>+<z>
}
```

The <tname>_loadi proto tells the compiler the instruction sequence that should be used to load a value of type <tname> into a register from memory. The <tname>_storei proto tells the compiler the instruction sequence that should be used to store a value of type <tname> from a register into memory.

As described earlier, it is desirable that the compiler know how to move a value from one register to another. As with loads and stores, proto is used to instruct the compiler how to move values between registers. For each ctype <tname> declaration, there may be a

```
proto <tname>_move
  { out <tname> <x>,
    in <tname> <y> }
  { <tspec>, ... }
{
  <inst>...   // sequence of instructions that moves
              // register <y> to register <x>
}
```

For example, continuing with the Galois-field arithmetic GF unit, the proto declarations:

```
proto gf8_loadi {out gf8 t, in gf8* s, in immediate o} { } {
  LGF8.I     t, s, o;
}
proto gf8_storei {in gf8 t, in gf8* s, in immediate o} { } {
  SGF8.I     t, s, o;
}
proto gf8_move {out gf8 r, in gf8 s} { } {
  GFADD8I    r, s, 0;
}
``` would be required input to the preferred embodiment to have the compiler do register allocation of gf8 variables; they would also be required input to generate the task state switch sequence for the gf register file.

A final use of proto is to define the allowed conversions between built-in and new types, and between different new types. Conversion prototypes are not required; if, for example, a conversion between new type A and new type B is not specified, the compiler does not allow variables of type A to be converted to variables of type B. For each pair of new or built-in types <t1name> and <t2name> (at most one of which can be a built-in type; this mechanism does not allow specification of a conversion between two built-in types, since that conversion is already defined by the programming language) there can be up to three proto declarations of the form:

```
proto <t1name>__rtor__<t2name>
    { out <t2name> <x>,
      in <t1name> <y> }
    { <tspec>, ... }
{
    <inst>... // sequence of instructions that converts
             // type <t1name> in register <y> to type
             // <t2name> in register <x>
}
proto <t1name>__rtom__<t2name>
    { in <t1name> <x>,
      in <t2name>* <y>,
      in immediate <z> }
    { <tspec>, ... }
{
    <inst>... // sequence of instructions that stores
             // type <t1name> in register <x> as
             // type <t2name> at the address <y>+<z>
}
proto <t1name>__mtor__<t2name>
    { out <t2name> <x>,
      in <t1name>* <y>,
      in immediate <z> }
    { <tspec>, ... }
{
    <inst>... // sequence of instructions that loads
             // type <t1name> from the address <y>+<z>
             // as type <t2name> into register <x>
}
```

For example, continuing with the Galois-field arithmetic GF unit, the proto declarations:

```
proto gf8__rtom__char {in gf8 t, in char* s, in immediate o} {} {
    SGF8.I    t, s, o;
}
proto char__mtor__gf8 {out gf8 t, in char* s, in immediate o}{} {
    LGF8.I    t, s, o;
}
``` would allow conversions between variables of type char in memory and variables of type gf8 in registers. With these protos, the following example shows how two vectors of chars can be added using the GFADD intrinsic:

```
void
gfadd__vector (char *char__vector0, char *char__vector1, int size)
{
    for (int i = 0; i < size; i++) {
        gf8 p0 = char__vector0[i];
        gf8 p1 = char__vector1[i];
        gf8 res = GFADD(p0, p1);
        char__vector0[i] = res;
    }
}
```

In prior art systems (e.g., the GNU C compiler), compilers maintain type information for each program variable and compiler-generated temporary variable. These built-in variable types correspond to the high-level-language types (e.g., in C, char, short, int, float, double, etc.). For each built-in type, the compiler must know the name of the type, the size and alignment requirements for the type, and the register file to which values of the type must be allocated. For new types, this information is provided by the ctype language construct. Using the ctype information, the compiler generates an internal type structure to represent that type, and uses that type for program variables and compiler-generated temporaries in a manner identical to that done for built-in types.

The prior art GNU C compiler represents types internally using the enumerated type machine_mode. Related types are grouped together in classes, described by the enumerated type mode_class. To support the new types, one skilled in the art can add an enumerator to mode_class to represent the class of types that represent user-defined types, and can add one enumerator to machine_mode for each new type declared using the ctype TIE language construct. For example, assuming the class representing the new types is called MODE_USER, the definition of mode_class in file machmode.h becomes:

enum mode_class {MODE_RANDOM, MODE_INT, MODE_FLOAT, MODE_PARTIAL_INT, MODE_CC, MODE_COMPLEX_INT, MODE_COMPLEX_FLOAT, MODE_USER, MAX_MODE_CLASS};

Enumerators are added to machine_mode by inserting lines in file machmode.def. Each line defines a new type, its name, its class, and its size (given in 8-bit bytes). Enumerators for user-defined types are named U<n>mode, where 0<n> is a number between zero and the total number of user-defined types. For example, to add an internal type to represent user-defined type gf8 from the earlier example, the following line is added:

DEF_MACHMODE (U0mode, "U0", MODE_USER, 1, 1, VOIDmode)

One skilled in the art can then modify the analysis and optimization applied by the GNU C compiler to perform correctly on types of the MODE_USER class.

In prior art compilers, the code selector (or code generator) is responsible for substituting a sequence of low-level instructions (corresponding more or less to assembly instructions) for each internally represented instruction. The code selector determines which instruction sequence to substitute by examining the operation performed by the internal instruction, and by the type of the operands to the instruction. For example, an internal instruction representing an add may have as input two values of type int and have as output one value of type int; or may have as input two values of type float and have as output one value of type float. Based on the types of the input and output values, the code selector chooses either the sequence of instructions to perform an integer add or the sequence of instructions to perform a floating-point add. For user-defined types, the load, store, move, and conversion proto definitions describe the instruction sequences to substitute for internal instructions that have one or more operands with a user-defined type. Continuing with the Galois-field arithmetic GF unit example, if the internal instruction represents a load of a gf8 value, the code selector consults the gf8_loadi proto to determine the instruction sequence that should be substituted for that instruction.

In the prior art GNU C compiler, the instructions available in the target processor are described using instruction patterns; see, e.g., Stallman, "Using and Porting GNU CC" (1995) for more information. These instruction patterns describe the instruction, including the number and type of the operands. To support user-defined types in the compiler, load, store, move, and conversion proto is converted to the instruction pattern expected by the compiler. For example, the gf8_load proto is represented with the following pattern (assuming the gf8 ctype has been mapped to machine_mode enumerator U0mode):

```
(define_insn " "
 [(set (match_operand:U0 0 "register_operand" "v")
  (match_operand:U0 1 "memory_operand" "U"))]
 " "
 "LGF8.I\t%0, %1")
```

Protos that specify a temporary register are converted to an instruction pattern that overwrites or "clobbers" an operand of the appropriate type. The compiler will ensure that the clobbered operand is unused at the location of the instruction, so that the instruction can use it as a temporary. For example, the following load proto for user-defined type tt generates an instruction pattern containing a clobber:

```
proto tt_loadi { out tt x, in tt* y, in immediate z } { char t } {
L8UI t, y, z;
MVTT x, t;
}
(define_insn " "
 [(parallel [(set (match_operand:U0 0 "register_operand" "v")
  (match_operand:U0 1 "memory_operand" "U"))
  (clobber (match_operand:U0 2 "register_operand" "a"))])]
 " "
 "L8UI\t%2, %1\nMVTT\t%0, %2")
```

Intrinsic Function Declaration

In the Killian et al. application, an intrinsic function declaration file is generated that contains definitions of all TIE instructions as functions using GNU asm statements. In particular, each instruction function is qualified with the C volatile property to suppress optimization that could otherwise occur. This method, though safe, prevents certain compiler optimizations where the TIE instructions can be safely re-ordered. The present invention improves the prior art system in two ways. First, only the load and store instructions are declared as volatile, therefore giving the compiler maximum freedom to reorder the instructions during code optimization. In the second improvement, instructions using special and user-declared states are declared with an explicit state argument, therefore giving compiler more accurate information about the side effect of the instructions. The following header file is generated from the TIE compiler to declare all instructions in the GF example as intrinsic functions:

```
/* Do not modify. This is automatically generated.*/
typedef int gf8 __attribute__ ((user("gf8")));
#define GFADD8_ASM(gr, gs, gt)     { \
__asm__ ("gfadd8 %0,%1,%2" : "=v"(gr):"v"(gs),"v"(gt));\
}
#define GFADD8I_ASM(gr, gs, imm4)     { \
__asm__ ("gfadd8i %0,%1,%2" : "=v"(gr):"v"(gs),"i"(imm4));\
}
#define GFMULX8_ASM(gr, gs)     { \
register int __xt_state asm ("state"); \
__asm__ ("gfmulx8
%1,%2":"+t"(__xt_state),"=v"(gr):"v"(gs));\
}
#define GFRWMOD8_ASM(gt)     { \
register int __xt_state asm ("state"); \
__asm__ ("gfrwmod8 %1":"+t"(__xt_state),"=v"(gt):"1"(gt));\
}
#define LGF8_I_ASM(gt, ars, imm8)     { \
__asm__ \
```

-continued

```
volatile("lgf8_i %0,%1,%2":"=v"(gt):"a"(ars),"i"(imm8)); \
}
#define SGF8_I_ASM(gt, ars, imm8)     { \
__asm__ \
volatile("sgf8_i %0,%1,%2"::"v"(gt),"a"(ars),"i"(imm8)); \
}
#define LGF8_IU_ASM(gt, ars, imm8)     { \
__asm__ volatile("lgf8_iu %0,%1,%3" : \
"=v"(gt),"=a"(ars):"1"(ars), "i" (imm8)); \
}
#define SGF8_IU_ASM(gt, ars, imm8)     { \
__asm__ volatile("sgf8_iu %1,%0,%3" : \
"=a" (ars) : "v" (gt), "0" (ars), "i" (imm8)); \
}
#define LGF8_X_ASM(gr, ars, art)     { \
__asm__ volatile("lgf8_x %0,%1,%2" : \
"=v" (gr) : "a" (ars), "a" (art)); \
}
#define SGF8_X_ASM(gr, ars, art)     { \
__asm__ volatile("sgf8_x     %0,%1,%2" : : \
"v" (gr), "a" (ars), "a" (art)); \
}
#define LGF8_XU_ASM(gr, ars, art)     { \
__asm__ volatile("lgf8_xu     %0,%1,%3" : \
"=v" (gr), "=a" (ars) : "1" (ars), "a" (art)); \
}
#define SGF8_XU_ASM(gr, ars, art)     { \
__asm__ volatile("sgf8_xu     %1,%0,%3" : \
"=a" (ars) : "v" (gr), "0" (ars), "a" (art)); \
}
```

In the above sample output, arithmetic instructions such as GFADD8I are not declared as volatile. Load and store instructions such as LGF8_I are declared as volatile. Instructions which read or write processor states such as GFRWMOD8 have one more argument _xt_state to signal the compiler that these instructions has side effects.

Register Allocation

Prior art systems (e.g., the GNU C compiler) include register allocation algorithms designed for portability. Portability requires that the compiler support a wide variety of ISAs. Even though these ISAs are not themselves configurable or extensible, a compiler that must target any of them must take a generic approach to register allocation. Thus, prior art systems may allow multiple register allocation, and some may restrict programming language types to certain register files.

The prior art GNU C compiler allows any number of register files to be specified by modifying the machine description of the target. One skilled in the art can add support to GCC for one or more new register files by modifying the machine description for the target as described in "Using and Porting GNU CC".

For each TIE regfile construct, the compiler is automatically configured to assign values to the registers in that register file. The regfile construct indicates the number of registers in the register file. As described above, the TIE ctype construct specifies the register file that values of that type should be assigned to. The compiler uses this information, as well as the number of registers in the register file, when attempting to assign each program value that has a user-defined type. Continuing with the Galois-field arithmetic GF unit example, the regfile construct for the gf registers is:

regfile gf8 16 g

This indicates that there are 16 gf registers, each with size 8 bits. The Ctype construction for the gf8 type is:

ctype gf8 8 8 gf, indicating the values of type gf8 must be assigned to the gf register file. Thus, the compiler will allocate all values of type gf8 to the gf register file, which has 16 registers.

Instruction Scheduling

Prior art systems (e.g., the GNU C compiler) include instruction scheduling algorithms that reorder instructions to increase performance by reducing pipeline stalls. These algorithms operate by simulating the target processor's pipeline to determine the instruction ordering that results in the fewest number of stall cycles, while satisfying other pipeline constraints such as issue width, and function unit availability.

The prior art GNU C compiler simulates the processor's pipeline by determining, for any pair of instructions, the number of stall cycles that would result if one instruction were scheduled immediately after another. Based upon the stall information for each instruction pair, the compiler attempts to find an ordering of instructions that minimizes the total stall cycles. For new TIE instructions, the compiler determines the stall cycles by using information provided by the TIE language schedule construct. To determine the number of stalls that would occur if instruction B is scheduled immediately after instruction A, the compiler compares the pipeline stage for the write of each output operand in A with the pipeline stage for the read of each corresponding input operand in B. For each operand, the difference in these values, plus one (because of the schedule construct's semantics for defined operand pipeline stage values), indicates the minimum number of cycles that must separate A from B to avoid stalls. A value of one indicates that B can be schedule immediately after A without stalling, a value of two indicates that scheduling B immediately after A will result in one stall cycle, etc. The maximum stall value over all operands written by A is the number of stall cycles that would result if B were scheduled immediately after A.

Consider the following example scheduling constructs:

```
schedule aload { ALD }
{
    use imm8 0;
    use ars 1;
    def xt 2;
}
schedule aadd { AADD }
{
    use xa 1;
    use xb 2;
    def xc 2;
}
```

In the following code sequence, the xt operand in the ALD instruction, x3, is the same as the xa operand in the AADD instructions. Thus, the AADD instruction must be scheduled (def xt)−(use xa)+1=2−1+1=2 cycles after the ALD to avoid stalling. If AADD is scheduled immediately after ALD, then there is a one cycle stall.

```
ALD     x3, a0, 0
AADD    x0, x3, x1
```

In the following code sequence, the xt operand in the ALD instruction, x3, is the same as the xb operand in the AADD instructions. Thus, the AADD instruction must be scheduled (def xt)−(use xb)+1=2−2+1=1 cycle after the ALD to avoid stalling. In this case, if AADD is scheduled immediately after ALD, there is no stall.

```
ALD     x3, a0, 0
AADD    x0, x1, x3
```

Lazy State Switch

Adding register files to processors significantly increases the quantity of state that must be saved and restored as part of task switching in a multi-tasking environment as implemented by most real-time operating systems. Because the additional state is often specific to certain computations which are performed in a subset of the tasks, it is undesirable to save and restore this additional state for every task switch because doing so unnecessarily increases the task switch cycle count. This can also be an issue in non-extensible processors for which a solution exists in the prior art. For example, the MI R2000 CPENABLE bits allow for "lazy" switching of coprocessor registers from one task to another. The preferred embodiment allows lazy switching to be applied to the state created via processor extension (the TIE state and regfile declarations).

This is one of the most complex of the save and restore operations. It is complex for several reasons: it is happening at a point in time delayed from the context switch; the run-time must manage the validity of each coprocessor file; and the core itself is changing the validity of the coprocessors as exceptions occur.

To show how this can be handled, assume there is a system with two tasks, A and B. There also are two coprocessor registers, cp_0 and cp_1. The state of the system consists of the valid bits that are kept by the core and the register file owner records that are kept by the run-time. Consider, then, the sequence of events shown in TABLE I below. In this example, coprocessor state is assumed to be stored at the base of the stack of each task.

TABLE I

| 0 Valid | 1 Valid | 0 Owner | 1 Owner | Event | Comment |
|---|---|---|---|---|---|
| x | x | x | x | | Core comes up in an unknown state |
| 1 | 1 | none | none | Initialization | At first the system sets all the register files as valid. It then calls the init routine to set state for each file. |
| 0 | 0 | none | none | | At the end of initialization, the system declares all register files as invalid for use and no owners for the register files. |
| 0 | 0 | none | none | Task A is created | During the creation of Task A, the OS makes sure to use the |

TABLE I-continued

| 0 Valid | 1 Valid | 0 Owner | 1 Owner | Event | Comment |
|---------|---------|---------|---------|-------|---------|
|  |  |  |  |  | init_mem calls to initialize the base of Task A's stack to the "safe" values for initial restore. Task A's stack pointer is set to start after this save area. The state of the coprocessors is not affected. |
| 0 | 0 | none | none | Task B is created | Task B's creation is just like Task A's creation. |
| 1 | 0 | A | none | Task A uses cp_0 | The use of the register file causes an exception. The exception sets the valid bit. Because there was not a previous owner of cp_0, no save of data is performed. Since Task A accesses the coprocessor, Task A's data for this coprocessor is loaded into cp_0. The ownership of cp_0 is assigned to A. |
| 0 | 0 | A | none | Task B swaps in | After the swap, the runtime left A's state in the cp_0 register file. The register file was marked as invalid but A was left as the owner. |
| 0 | 1 | A | B | Task B uses cp_1 | As before, when A first used cp_0, the exception set the valid bit. The run-time saw that cp_1 had not previously been used and so did not do a restore. The run-time loaded B's state into cp_1 and set the owner of cp_1 to B. |
| 1 | 0 | A | B | Task A swaps in | On this swap there is more work to do. The run-time clears the valid bit for cp_1 because B is swapping out and is the owner of cp_1. Seeing that A is swapping in, it set the valid bit for cp_0. Task A can use cp_0 without causing an exception. Note that this is merely one implementation of this process. All valid bits could be turned off and if A touches the coprocessor, the run-time could, in the exception, recognize that A's state is already loaded into cp_0 and avoid the restore at that point. The exception would have set the valid bit. |
| 1 | 0 | A | B | Task A uses cp_0 | Because A's state is already in cp_0, the run time has already set the valid bit on the context switch. Since the valid bit is set, no exception occurs and no action must be taken by the run-time. |
| 1 | 1 | A | A | Task A uses cp_1 | Task A's use of cp_1 causes an exception. This exception sets the valid bit for cp_1. The run-time, seeing that Task B owned cp-1, saves the contents of cp_1 to Task B's stack. It then restores Task A's state to cp_1. |
| 0 | 1 | A | A | Task B swaps in | All of the valid bits owned by Task A are turned off. There are no coprocessors owned by Task B and so no valid bits are turned on. |
| 0 | 1 | A | B | Task B uses cp_1 | Task B's use of cp_1 causes an exception. This exception turns on the valid bit for cp_1. The run-time sees that Task A currently owns cp_1 and saves the current state to Task A's save area. The run time then restores Task B's state to cp_1. |

Processing continues . . .

The lazy switch mechanism requires that state be grouped into sets to which access can be enabled or disabled, access to disabled states cause an exception, the exception handler can determine which state must be switched, and the exception handler can save to memory and restore from memory the state and re-enable access.

In the preferred embodiment, the TIE construct
coprocessor <came><cumber>{<sname>, . . . } declares that the state named by <sname>, . . . is a group for the purpose of lazy switching. This grouping is given the name <came>, and a number <cumber> in the range 0 to 7. It is an error if any of <sname>, . . . are named in more than one coprocessor statement.

Given the above construct, a list of instructions are created that have <sname> in the in/out/inout list of the iclass. A signal is then created that is the OR of the instruction one-hot decodes for these instructions. This signal is ANDed with the complement of the CPENABLE bit. These signals generated for each processor are then combined with the TIE source code generated exceptions described in greater detail below in the Exceptions section. All coprocessor disabled exceptions have higher priority than any exceptions from the TIE source code. Between the coprocessor disabled execptions, the lowest number exception has priority.

In the core processor of the preferred embodiment, different exceptions all use the same vector and are distinguished by the code loaded into the EXCCAUSE register by the exception. The core processor has reserved eight cause codes (from 32 to 39) for these exceptions. In response to the coprocessor statement, the TIE compiler adds bit <cumber> to the CPENABLE register, adds logic to the processor to cause an exception if <cumber> is clear and any instruction accessing <sname>, . . . is executed, and adds logic to the processor to load 32+<cnumber> into the EXCCAUSE register when that exception is recognized by the core.

Multi-Cycle Instructions in TIE

In the prior processor art, instructions that require multiple cycles of computation require additional logic to pipeline the combinatorial logic of the computation and to prevent instructions that depend on not-yet-computed results from issuing. In addition, compilers for such processors should include algorithms to reorder instructions to minimize pipeline stalls.

The first item is typically implemented by processor designers by writing logic that has pipeline registers inserted at carefully chosen locations. The second item is typically implemented by comparing the source operands of an instruction to be issued to all not-yet-computed destination operands in the pipeline, and holding the instruction if there is a match.

These three items must be coordinated. If the pipelining of the computational logic does not match the changes to the issue logic, then the processor may produce incorrect results. If reordering to minimize pipeline stalls is inconsistent with pipelining the combinational logic, then sub-optimal performance will result (e.g., scheduling a use of a result before it is ready will result in a pipeline stall).

Take the following example:

| | |
|---|---|
| MUL a3, a4, a5 | /* a3 = a4 * a5, a 2-cycle instruction */ |
| ADD a6, a3, a7 | /* a6 = a3 + a7, a single cycle instruction */ |
| SUB a2, a0, a1 | /* a2 = a0 - a1, a single cycle instruction */ |

If MUL logic is carried over two cycles but the control logic issues one instruction every cycle, a6 will have incorrect results because a3 does not have the correct value at the time the ADD instruction needs it. To be correct, the issue logic must know that MUL is pipelined over two stages and stall one cycle before issuing the ADD instruction. Even though stalling ADD instruction by one cycle results in correct logic, it does not provide optimal performance. By switching the order of ADD and SUB instructions, it is no longer necessary to stall any instructions in this example and therefore result in optimal performance. This can only be achieved by appropriate coordination between implementation of MUL logic, implementation of instruction issuing logic, and instruction re-ordering (scheduling).

In prior art systems, these three items (pipeline logic, pipeline stalling and instruction rescheduling) are often implemented separately, making coordination more difficult and increasing design verification requirements. The preferred embodiment of the present invention provides a method of specifying the information required for these features once, and implementing the three items in the processor generator from that specification.

In addition, the instruction set simulator of the preferred embodiment uses the same specification of scheduling information in its timing model. This allows application developers using all the features of the preferred embodiment to get good predictions of performance before the hardware is built without running their applications on a slow HDL simulator.

Appendix C (Chapter 10 of the Xtensa™ Instruction Set Architecture (ISA) Reference Manual by Killian and Warthman, incorporated herein by reference) discloses a method of describing pipeline hardware that has been used to model the performance of processor pipelines and which has been used in the prior art for minimizing pipeline stalls. In the preferred embodiment, however, this description is additionally used for the first two items above.

In particular, the TIE language now includes the declaration

--- schedule <schedulename> { <iname>, ... }
in <oname> <stage>;
.
.
.
out <oname> <stage>;
.
.
.
}
where <iname> are the names of instructions;
<oname> is an operand or state name, and
<stage> is an ordinal denoting a pipeline stage.

---

The def stage numbers used by TIE are one less than the values described in Appendix C and thus the separation between instructions is max(SA−SB+1, 0) instead of max (SA−SB, 0).

Based on this specification, the TIE compiler as described in the Killian et al. and Wilson et al. applications is extended to insert pipeline registers into the semantic logic specification as follows. A stage number is assigned to every input to the semantic block. Instruction decode signals and immediate operands are assigned implementation-specific numbers (0 in the preferred embodiment). Register source operands, state registers, and interface signals (described below) are assigned stage numbers from the TIE schedule declaration (with an implementation-specific default—1 in the preferred embodiment). Next, each node of the semantic block is visited in postorder (that is after each of its predecessor nodes has been visited). The stage number of the node NS is the maximum stage number of any of its inputs. For each input with a stage number IS<NS, the compiler inserts NS–IS pipeline registers between the input and the node. Finally, the output register operands, state registers and interface signals are visited. If the stage number from the semantic block IS is greater than the stage number OS declared in the schedule statement, the input TIE specification is in error. Otherwise if OS>IS, then insert OS–IS pipeline registers before the output.

This process is illustrated with the following example:

```
state s1 1
state s2 32
state s3 32
iclass complex {example} {out arr, in ars, in art} {in s1, in s2, in s3}
semantic complex {example} {
wire [31:0] temp1 = s1 ? ars : art;
wire [31:0] temp2 = s2 – temp1;
assign arr = s3 + temp2;
}
schedule complex {example} {
in ars 1;       /* using operand ars in stage 1 */
in art 1;       /* using operand art in stage 1 */
in s1 2;/* using state s1 in stage 2 */
in s2 2;/* using state s2 in stage 2 */
in s3 1;/* using state s3 in stage 1 */
out arr 3;      /* defining operand arr in stage 3 */
}
```

Figure 8A:
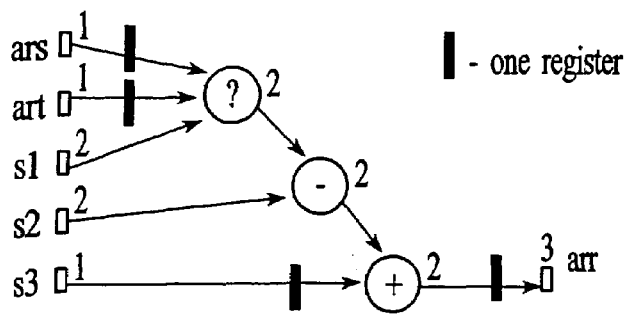
FIGS. 8(a)-8(c) show pipeline register optimization according to the preferred embodiment.
Figure 8B:
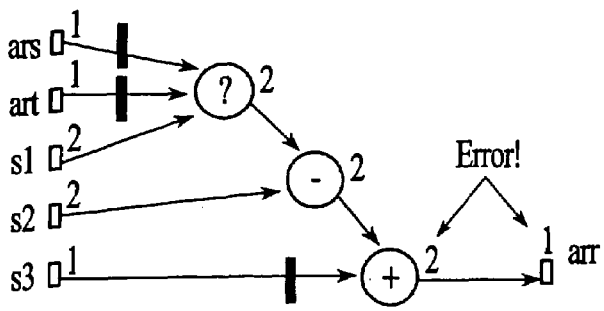

This example specifies that the instruction "example" uses operands ars, art and state s3 in stage 1 and states s1 and s2 in stage 2. It produces result operand arr in stage 3. For this description, the above register-insertion procedure would produce the circuit in FIG. 8(a). The NS of node "?" is 2 because the maximum input stage is 2. Because the IS of ars and art are 1, one register is inserted at the respective inputs of node "?". Similarly at node "+", the s3 input is delayed by one stage to match the other input. Finally, the output of node "+" is delayed by one stage before assigned to arr. If in the schedule description of the above example arris declared as "out arr 1", the pipeline insertion procedure would product circuit in FIG. 8(b). Since the NS of node "+" is 2 and the OS of arr is 1, the procedure would issue an error message since the input schedule requirement is unsatisfiable.

Figure 8C:
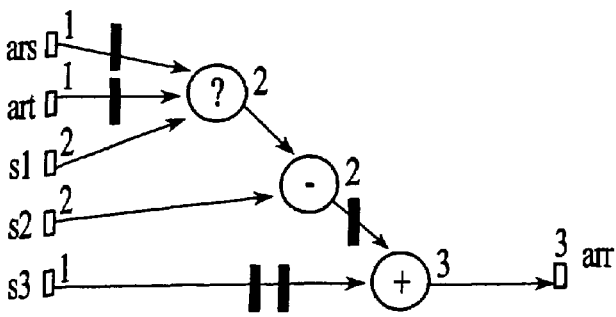

The above algorithm correctly inserts pipeline registers as necessary, but the placement of these registers is far from optimal. It is necessary to use a pipeline register optimization algorithm, such as found in Synopsys' DesignCompiler, after initial insertion to generate acceptable logic for synthesis. This is typically done by moving registers across combinational logic to balance the logic delays on both sides of the registers. Using the above example, the register optimization would produce a circuit such as the one in FIG. 8(c) in which the register at the output of node "+" is moved to the inputs in order to balance the delay and reduce the cycle time.

In some cases, it may be desirable to have a semantic block that uses or defines a register operand in one pipeline stage for one instruction, and in another stage for a different instruction because the two instructions may share some common logic. Specifying the instructions in two separate semantic blocks would require unnecessary duplication of logic.

This is a possible extension in a variation on the preferred embodiment. This capability would be supported by using separate signal names in the semantic block for two operands, e.g., <operand>@<stage> instead of just <operand>. Once this modification is made, the above algorithms operate correctly even in the multi-system environment.

For example, if one wants to have the following two instructions
inst1: arr=ars+art
inst2: arr=ars+art+s1 and for some reason s1 must be a stage 1 input and the cycle time requirement is such that there is only time to perform one addition in a cycle. Using the above mentioned extension, the semantic description would look like

```
semantic two {inst1, inst2 } {
wire [31:0] temp = ars + (inst1 ? art : s1);
assign arr = temp;
assign arr@2 = temp + art@2;
}
```

By describing two instructions in a single semantic block with the extended signal names ars@2 and art@2, the two instructions can be implemented with only two adders instead of three had the two instructions be described in two separate semantic blocks.

Exceptions

Most processors have some mechanism for instructions to conditionally cause an exception instead of completing. For example, a divide instruction may cause an exception when the divisor is zero. The preferred embodiment of the present invention supports this capability from TIE by first declaring the new exception exception <ename><exceptioncode>{<exc1>, . . . }<string> where <ename> is the name of the instruction and the signal used in semantic blocks to raise it; <except ioncode> is the value passed to the software exception handler to distinguish this exception from others; <exc1>, etc., are lower-priority exceptions; and <string> is a descriptive string to be used in the documentation.

Figure 9:
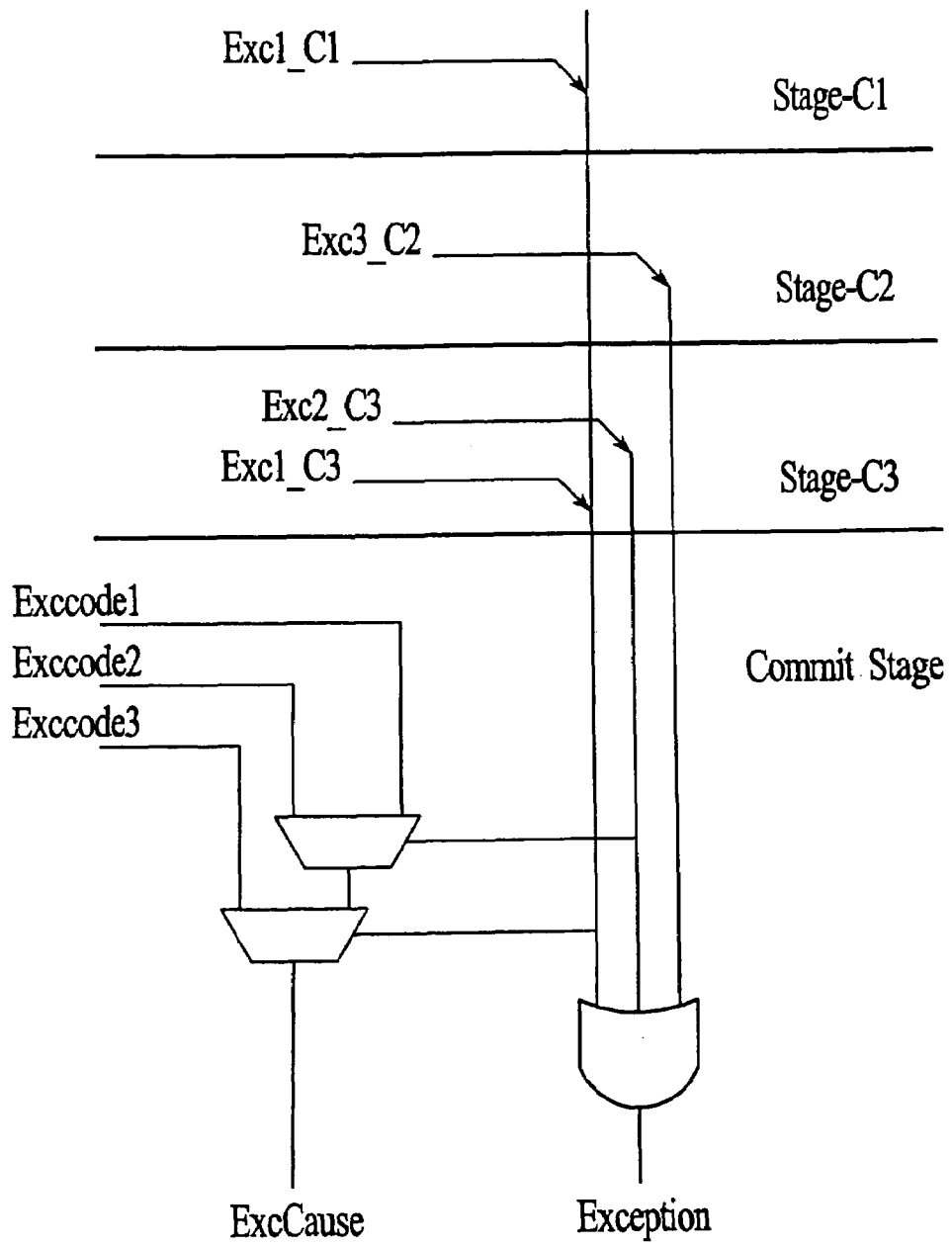
FIG. 9 shows exception processing in the preferred embodiment.

Once declared, exception signals may be listed in iclass declarations as described above. With this declaration, a single-bit signal having the exception's name is created within semantic TIE blocks containing the defined instruction, and this signal must be assigned. FIG. 9 shows the logic generated by the TIE compiler to combine exception signals from multiple TIE blocks and to prioritize between exceptions when more than one are signaled by a single instruction.

The exception signal may also be given a stage number in the schedule declaration. However, in the preferred embodiment, the core processor processes all exceptions in its M pipeline stage. For this implementation, the stage number specified by the schedule declaration is checked to ensure that it is less than or equal to the stage number of the M-stage, and if not an error is signaled at compile time. If the specified stage number is less than or equal to the stage number of the M-stage, then the stage number of the M-stage is used instead. Thus, the logic of FIG. 9 is evaluated in the M-stage.

As shown in FIG. 9, the exception signal generated by each semantic block is ANDed with the OR of the one-hot instruction decode signals that declare the exception signal in their interface section (this allows the TIE code to only produce a valid exception signal when instructions that raise that exception are executed). Next, all of the exception signals are ORed to produce a single signal indicating that some exception is occurring. This signal is processed by the core as in the prior art.

Finally, a priority encoder is used to determine which exception code will be written into the core processor's EXC- CAUSE register. The list of lower priority exceptions is used to form a directed graph (if a cycle is detected, it is considered a compile-time error). A topological sort of this graph is created (e.g., as in the Unix t sort program), and the resulting order is used to do a priority encode of the various exception signals. The result of the priority encode is then used to select the corresponding exception code in a mux. This signal is then processed by the core as in the prior art.

As an example, FIG. 9 shows the logic for the following TIE description of three prioritized exception signals all of which happens in cycle N:

```
iclass i1 {inst1} {...} {...} {out exc1}
iclass i2 {inst2} {...} {...} {out exc2}
iclass i3 {inst3} {...} {...} {out exc3}
iclass i4 {inst4} {...} {...} {out exc1}
exception <exc1> <exccode1> { } "Low level exception
    condition"
exception <exc2> <exccode2> {exc1} "Medium level exception
    condition"
exception <exc3> <exccode3> (exc2) "High level exception
    condition"
schedule s1 {inst1} { def exc1 1; }
schedule s2 {inst2} { def exc2 3; }
schedule s3 {inst3} { def exc3 2; }
schedule s4 {inst4} { def exc1 3; }
```

In this case, exception exc1 can be raised by inst1 in C1 and by inst4 in C3, exc2 by inst2 in C3, and exc3 by inst3 in C2. In this embodiment, all exception signals are generated in their declared stages and pipelined forward to the commit stage at which point the exception cause value is computed by selecting the exception code by the priority of exception signals as specified in the above TIE description. The exception signal Exception and the cause signal ExcCause feed to the core. Once an exception is handled, the core will issue a signal back to TIE logic to kill all the instruction in the pipeline and effectively clear the remaining unhandled exceptions.

Figure 10:
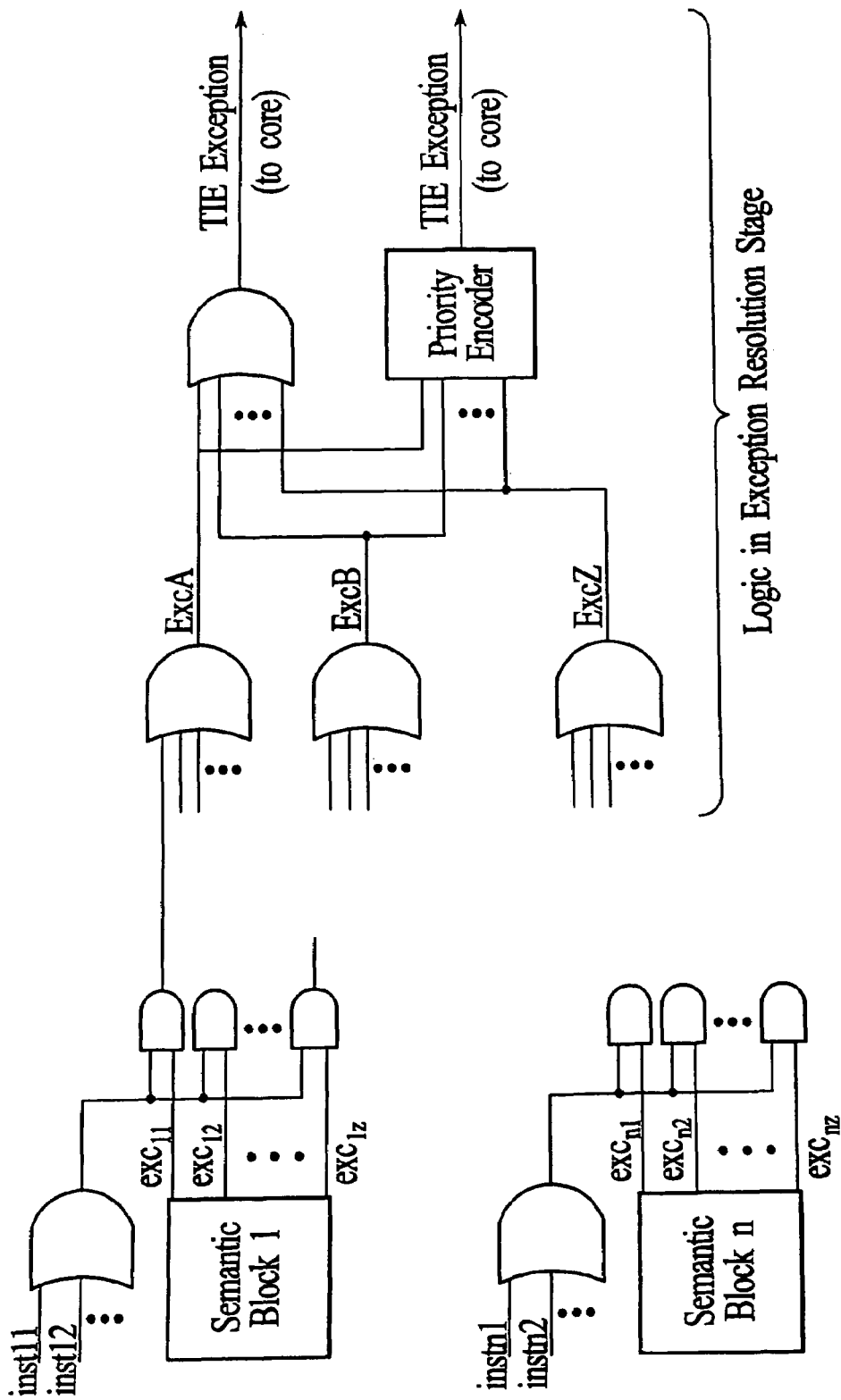
FIG. 10 shows further exception processing in the preferred embodiment.

As another example, FIG. 10 shows a circuit described by the code below which has two exceptions and some instructions that generate one exception and one that generates both. In this example, Overflow is lower-priority than Divide by Zero (actually both cannot occur at the same time in a divide, so the relative priority is irrelevant).

In the Figure, it should be noted that each pictured semantic block generates some subset of the total set of TIE exceptions; thus, exact wirings are input-dependent. Further, in the semantic blocks, exception outputs are pipelined to the resolution stage by the TIE schedule mechanism.

```
exception Overflow 40 { } "Integer Overflow"
exception DivZero 41 { Overflow } "Integer Divide by Zero"
iclass ov { ADDO, SUBO, MULO, DIVO } { out arr, ars, art }
    { out Overflow }
reference ADDO {
    wire [32:0] t = {ars[31],ars} + {art[31],art};
    assign Overflow = t[32] != t[31];
    assign arr = t[31:0];
}
reference SUBO {
    wire [32:0] t = {ars[31],ars} - {art[31],art};
    assign Overflow = t[32] != t[31];
    assign arr = t[31:0];
}
reference MULO {
    wire [63:0] t = {{32{ars[31]},ars} * {{32{art[31]},art};
    assign Overflow = t[63:32] != {32{t[31]}};
    assign arr = t[31:0];
}
semantic { ADDO, SUBO } {
    wire [32:0] t = {ars[31],ars} + ({ars[31],art} ^
        {{33}SUBO}) + SUBO;
    assign Overflow = t[32] != t[31];
    assign arr = t[31:0];
}
semantic { DIVO } {
    assign DivZero = art == 32'b0;
    assign Overflow = (ars == 32'h80000000) & (art==
        32'hffffffff);
    assign arr = ...;
}
```

FIG. 10 shows an arrangement in which all TIE exceptions have a single fixed priority relative to all core exceptoins. A straightforward extension would allow the TE exception statement to refer explicitly to various core exceptions. The TIE compiler would then be able to generate a priority encoder than combines TIE and core exceptions.

Reference Semantics

Systems such as those described in the Killian et al. and Wilson et al. applications have a single semantic definition of each instruction. This semantic definition was used for generating both the hardware and the software representing the instruction. Such systems allowed multiple instructions to be defined together, differentiated by the one-hot instruction decode input signals (e.g., so Add and Subtract instructions can share an adder). Use of this feature is necessary to generate efficient hardware. With the increasing complexity of instructions that can be defined with the preferred embodiment, an efficient set of implementation semantics becomes more difficult to read, write, verify and understand. They also become more tuned for pipelining and less abstract. This is because the description has to take into account pipeline effect and create signals where the pipeline registers can be moved.

For example, given a floating-point implementation in TIE, one would probably write different code for targeting a 2-cycle floating-point add operation as opposed to a 3 or 4-cycle floating-point add operation. It is less abstract because programmers often optimize code to generate fewer gates at the expense of clarity. For example, one might write
    assign x=y*3;
in reference semantics (quite clear), but
    assign x=y+{y[30:0],1'b0};

in implementation semantics because software development tools don't handle the multiply by a constant case as well as can be done manually, or the like.

As another example, to describe a multiply-accumulate instruction in a reference, it is as simple as
    acc=a*b+acc;
But in semantic description, one has to take into account that this instruction has to be implemented over two pipeline stages. A skilled hardware designer will know that a partial result of a*b needs to be computed using a carry-save-adder tree in the first stage and the final result of adding the two partial result with acc is computed in the second stage.

Finally, implementation semantics become slower when translated to simulation software because the correspondence to the native machine instruction is lost. Using the previous instruction, the reference description can be simulated using two instructions. Simulating the semantic description in this case would take hundreds of instructions.

For the above reasons the preferred embodiment allows the specification of two sets of semantics. One set is called the reference semantics. There is one reference semantic per instruction, and there is no sharing of semantics between instructions. This semantic definition is generally written for clarity to define the expected operation of the instruction. The second set of semantics, implementation semantics, is for hardware implementation. These semantics retain the features of prior art systems to allow hardware to be shared by multiple instructions and will generally be written at a lower level with gate-level synthesis in mind.

This can be illustrated with a simple TIE example that defines two instructions ADD and SUB as follows:

```
iclass rrr {ADD, SUB} {out arr, in ars, in art}
iclass rr {NEG} {out arr, in ars}
reference ADD {
assign arr = ars + art;
}
reference SUB {
assign arr = ars – art;
}
reference NEG {
assign arr = –ars;
}
semantic alu {ADD, SUB, NEG} {
wire [31:0] l, r;
assign l = SUB ? ~art : NEG ? ~ars : art;
assign c = (SUB|NEG) ? 1 : 0;
assign r = NEG ? 0 : ars;
assign arr = l + r + c;
}
```

The reference descriptions are simple and direct. The semantic description, however, has to concern itself with the implementation efficiency, specifically in this case to share the adders required by the three instructions. To do this, it relies on the mathematical identity that subtracting a number is the same as adding the bit-wise complemented number and a constant of 1.

Reference semantics also allow an instruction set to be defined once, via the reference semantics, and then implemented multiple times with different sets of implementation semantics. Having a single ISA definition with multiple implementations is common practice in the industry, though usually the reference semantics are defined only in the ISA documentation instead of formally. The preferred embodiment reverses this typical procedure and defines the reference semantics formally and derives the documentation from the TIE specification, rather than vice versa.

Having separate reference and implementation semantics creates a need to verify their equivalence. In prior art systems, with the reference semantics in documentation, equivalence is checked by a human reading the documentation and writing tests to verify equivalence. This procedure is time consuming, and with the reference semantics specified in a precise language, it is possible to use logic equivalence tools to compare the reference semantics to the implementation semantics. The preferred embodiment automates this process by generating the necessary inputs to equivalence checking tools in two different ways, one for checking the equivalence of reference and implementation semantics for a particular instruction and one for checking that the entire circuit implemented using reference semantics is equivalent to that implemented using implementation semantics. The first method helps to debug the implementation semantic descriptions. The second method verifies the design as a whole including not only the logic specified by the semantics but also the glue logic for combining all the semantics.

Figure 11:
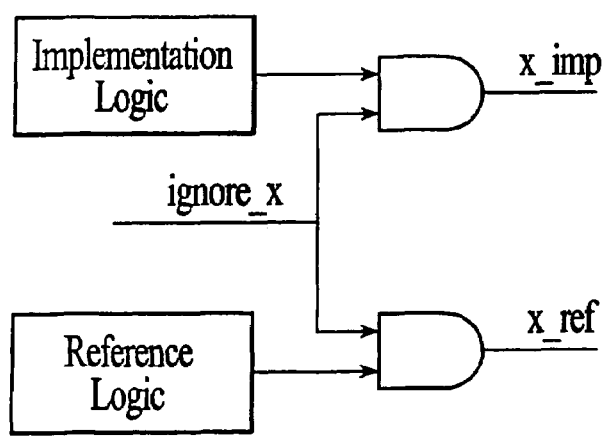
FIG. 11 shows the processing of reference semantic information in the preferred embodiment.

The circuits generated from reference and implementation semantics are in general not equivalent. For a given instruction, only a subset of output signals will be set. For the rest of the output signals, the reference and implementation semantics may choose to assign different values based on cost criteria or ease of description because they are logically "don't cares", i.e., they are unused. The preferred embodiment solves this problem by creating additional logic such that the output signals produced by a particular instruction are unchanged and the rest of output signals are forced to a particular logic value such as 0, as illustrated in FIG. 11. This Figure shows that each output signal x generated by the reference description (x_ref) and each generated by semantic description (x_impl) is ANDed with another signal ignore_x such that when x is not part of an instruction output, it is forced to 0, therefore avoiding false negative result from the equivalence checking tools. From the ICLASS statement, we know the set of instructions which set x; therefore, ignore_x is simply the logical OR of instructions not setting x.

Built-In Modules

Certain commonly-used computations have no language-defined operators. However, using other language constructs is either very tedious to decribe or very hard to implement efficiently. Tie provides the built-in operators shown in TABLE II below for some of these computations.

TABLE II

| Format | Description | Result Definition |
|---|---|---|
| TIEmul(a, b, sign) | Signed and unsigned multiplication | {{m{a[n–1] & s}} * {{n{a[m–1] & s}}, b}, where n is the size of a and m is the size of b |
| TIEmac(a, b, c, sign, negate) | Multiply-accumulate | n ? c – a * b : c + a * b |
| TIEadd(a, b, cin) | Add with carry-in | a + b + cin |
| TIEcsa(a, b, c) | Carry-save adder | {a & b | a & c | b & c, a ˆ b ˆ c} |

As an example, the following description shares an adder between ADD and SUB instructions:

assign arr=TIEadd(ars, SUB ? ~art: art, SUB);

The following semantic description adds four numbers using a carry-save adder (CSA) array followed by a full adder:

wire [31:0] s1, c1, s2, c2;
assign{s1, c1}=TIEcsa(d1, d2, d3);
assign{s2, c2}=TIEcsa(c1<<1, s1, d4);
assign sum=(c2<<1)+s2;

The advantage of using built-in modules such as these is that the TIE compiler can recognize the built-in modules and use a module generator to derive more efficient implementations for them.

Documentation

The reference semantics also are one important element of the instruction set documentation. A typical instruction set reference manual, an exemplary page of which is shown in FIG. 12, can include for each instruction its machine code format; its package; its assembler syntax; a synopsis (a one-line text description of the instruction); a full text description of the instruction; and a more precise operational definition of the instruction, as well as additional information such as assembler notes and exceptions associated with the instruction. All of the information necessary to generate the machine code format is already found in the TE specification since it contains the opcode bits and the operand fields. Similarly, the assembler syntax is derived from the mnemonic and operand names. The TIE reference semantics become the precise definition. Only the synopsis and text description are missing. The preferred embodiment therefore adds constructs to TIE to allow the instruction set designer to specify the synopsis and text description.

The TIE package specification has the format
package <pname><string>

.

.

.

endpackage <pname>

The package name <pname> is associated with all instructions defined between package and endpackage. Packages have other uses than for documentation, as described below. The <string> parameter gives the name of package for documentation purposes (it may have spaces).

The TE synopsis specification has the format
synopsis <iname><string> where <string> is a short (approximately half a line) description of the instruction. No formatting control is required in this text. This text is typically used for headings in books and additional material in instruction lists.

The TIE description specification has the format
description <iname><string> where <string> is a long (usually several paragraphs) string containing text describing the operation of the instruction in English or another natural language. There is a need for text formatting commands in this text. The preferred embodiment implements an HTML-like language (the specification for HTML may be found, e.g., at http://www.w3.org/TR/REC-html40). In addition, two optional documentation strings are supported:

assembly_note <iname><string>
implementation_note <iname><string>

These optional specifications provide additional per-instruction text.

Like HTML, two sorts of formatting controls are supported: elements and character entities. The intent is to specify the attributes of the data and not its exact appearance. The data will be rendered suitably for the output medium based on its attributes. The character entity &<name>; specifies characters not available in ASCII or that should use special rendering. Elements represent HTML-defined entities such as paragraphs, lists, code examples, etc. Quoting from the HTML 4.0 specification, "[e]ach element type declaration describes three parts: a start tag, content, and an end tag. The element's name appears in the start tag (written <ELEMENT-NAME>) and the end tag (written </ELEMENT-NAME>); note the slash before the element name in the end tag."

In other words, <ELEMENT-NAME>DOCUMENTATION</ELEMENT-NAME> specify a format to be applied to DOCUMENTATION. Unlike HTML, the end tag (</ELEMENT-NAME>) is never optional. There are two kinds of tags: block and inline. Block tags specify paragraph-like structure and inline tags are used to specify the formatting of text within those paragraphs. Inline TAGs may be nested. Block tags may not be nested, except for LI within UL.

These constructs are easily translated to HTML to create HTML documentation as part of a program such as the one in Appendix D that assembles an HTML page for each instruction, and an index of instructions. Such HTML documentation can be used to establish an on-line reference manual for processor users. A program for doing this in the preferred embodiment is written in the Perl programming language and works by creating a index.html file with an HTML table of two columns, one for the mnemonics and one for the synopsis text string. The rows of the table are filled by processing the instructions in sorted order. The instruction mnemonics are HTML-linked to a page created for each instruction.

The per-instruction page begins with an HTML level-1 heading ("H1") giving the mnemonic and synopsis. Next, various sections are introduced by fixed names in HTML level-2 headings ("H2"). The first section, labeled "Instruction Word", gives the machine code format represented by a HTML-table with one column per bit. Opcode bits ('0' or '1') are inserted in the corresponding table cells. Operand fields are filled in with the field name. Fields that span multiple adjacent bits use the COLSPAN feature of HTML tables to avoid repetition. The bits of the machine code box are numbered using a table row above, and the field widths are given in a row below.

The second section, labeled "Package", gives the TIE package name that defines the instruction. A simple hash is used to translate the package name from an identifier to the documentation string. The package name itself is output inside of an HTML paragraph block-element ("P").

The third section, labeled "Assembler Syntax", gives the assembly language format used to code the instruction. This consists of the instruction mnemonic, a space, and then the operand names separated by commas. Register operand names are formed by concatenating the short name of the register file with the field name. Immediate operand names are just the immediate name from TIE. The assembler syntax is output inside of an HTML paragraph block-level element ("P") using an HTML code inline-element ("CODE"). The code inline-element renders the text in a fixed width font that resembles the way programming language code is usually rendered.

The fourth section, labeled "Description", contains the text description, translated from TIE to HTML. Because TIE's formatting codes are similar to HTML's, this translation is fairly simple. The primary need is to translate the INSTREF element into an HTML link to the named instruction.

An optional fifth section, labeled "Assembler Note", contains that text translated from TIE to HTML.

The sixth section, labeled "Exceptions", contains a list of exceptions that this instruction can raise. Load and Store instructions automatically have the LoadStoreError exception added to the list by the TIE compiler. Other exceptions are listed if the corresponding exception signal is listed in the signal list section of the instruction's iclass. Exceptions are listed in priority order (the result of the topological sort described above).

A optional seventh section, labeled "Implementation Notes", contains that text translated from TIE to HTML.

It is possible to also copy the test case list from the TIE specification as described below into the documentation since this is sometimes useful to the reader.

An example of the documentation for a processor instruction is given below.

```
<html>
    <head>
        <title>
            GFADD8 - Galois Field 8-bit Add
        </title>
    </head>
    <body>
        <h1>
            GFADD8 — Galois Field 8-bit Add
        </h1>
        <h2>
            Instruction Word
        </h2>
        <table frame="void" rules="groups" cellspacing=0 cellpadding=0>
            <colgroup colspan=8><col width=28><col width=28><col width=28><col width=28><col width=28><col width=28><col width=28><col width=28><colgroup colspan=4><col width=28><col width=28><col width=28><col width=28><colgroup colspan=4><col width=28><col width=28><col width=28><col width=28><colgroup colspan=4><col width=28><col width=28><col width=28><col width=28><colgroup colspan=4><col width=28><col width=28><col width=28><col width=28>
            <thead>
            <tr>
            <td  width=28 align="center">
                <small>23</small>
            </td>
            <td width=28 align="center">
            </td>
            <td width=28 align="center">
            </td>
            <td width=28 align="center">
            </td>
            <td width=28 align="center">
            </td>
            <td width=28 align="center">
            </td>
            <td width=28 align="center">
            </td>
            <td  width=28 align="center">
                <small>16</small>
            </td>
            <td  width=28 align="center">
                <small>15</small>
            </td>
            <td width=28 align="center">
            </td>
            <td width=28 align="center">
            </td>
            <td  width=28 align="center">
                <small>12</small>
            </td>
            <td  width=28 align="center">
                <small>11</small>
            </td>
            <td width=28 align="center">
            </td>
            <td width=28 align="center">
            </td>
            <td  width=28 align="center">
                <small>8</small>
            </td>
            <td  width=28 align="center">
                <small>7</small>
            </td>
            <td width=28 align="center">
            </td>
            <td width=28 align="center">
            </td>
            <td  width=28 align="center">
                <small>4</small>
            </td>
            <td  width=28 align="center">
                <small>3</small>
            </td>
```

-continued

```
            <td width=28 align="center">
            </td>
            <td width=28 align="center">
            </td>
            <td   width=28 align="center">
               <small>0</small>
            </td>
         </tr>
      </thead>
      <tbody>
         <tr>
            <td width=28 align="center" bgcolor="#FFF0F5">
               0
            </td>
            <td width=28 align="center" bgcolor="#FFF0F5">
               0
            </td>
            <td width=28 align="center" bgcolor="#FFF0F5">
               0
            </td>
            <td width=28 align="center" bgcolor="#FFF0F5">
               0
            </td>
            <td width=28 align="center" bgcolor="#FFF0F5">
               0
            </td>
            <td width=28 align="center" bgcolor="#FFF0F5">
               1
            </td>
            <td width=28 align="center" bgcolor="#FFF0F5">
               1
            </td>
            <td width=28 align="center" bgcolor="#FFF0F5">
               0
            </td>
            <td colspan=4 width=112 align="center" bgcolor="#FFE4E1">
               r
            </td>
            <td colspan=4 width=112 align="center" bgcolor="#FFE4E1">
               s
            </td>
            <td colspan=4 width=112 align="center" bgcolor="#FFE4E1">
               t
            </td>
            <td width=28 align="center" bgcolor="#FFF0F5">
               0
            </td>
            <td width=28 align="center" bgcolor="#FFF0F5">
               0
            </td>
            <td width=28 align="center" bgcolor="#FFF0F5">
               0
            </td>
            <td width=28 align="center" bgcolor="#FFF0F5">
               0
            </td>
         </tr>
      </tbody>
      <tfoot>
         <tr>
            <td colspan=8 width=224 align="center">
               <small>8</small>
            </td>
            <td colspan=4 width=112 align="center">
               <small>4</small>
            </td>
            <td colspan=4 width=112 align="center">
               <small>4</small>
            </td>
            <td colspan=4 width=112 align="center">
               <small>4</small>
            </td>
            <td colspan=4 width=112 align="center">
               <small>4</small>
            </td>
         </tr>
      </tfoot>
   </table>
```

-continued

```
        <h2>
            Package
        </h2>
        <p>
        </p>
        <h2>
            Assembler Syntax
        </h2>
        <p>
            <code>GFADD8 gr, gs, gt</code>
        </p>
        <h2>
            Description
        </h2>
        <P><CODE>GFADD8</CODE> performs a 8-bit Galois Field addition of
the
        contents of GF registers <CODE>gs</CODE> and <CODE>gt</CODE> and
        writes the result to GF register <CODE>gr</CODE>.</P>
        <h2>
            Operation
        </h2>
        <pre>
        gr = gs ^ gt;
        </pre>
        <h2>
            Exceptions
        </h2>
        <p>
            None
        </p>
    </body>
</html>
```

Although HTML has been used as the documentation formatting language in the preferred embodiment, those skilled in the art will recognize that other equivalent specification languages, such as the Adobe Frame Maker MIF format, may also be used.

Sub-Fields

A development that makes embodiments of the present invention less sensitive to processor configuration options which change program execution characteristics is the ability to define a field as a sub-field of another field. This is in contrast to prior configurable processor systems which restricted the definition of fields to specified parts of instruction words, and did not permit them to be defined as parts of other fields. The ability to define fields as parts of other fields allows the software to in part be independent of the endianness of the configured processor.

For example, in prior systems a new field t10 that corresponds to the first two bits of the t field can only be defined wiith either of the following TIE statements:

field t10 inst[5:4} /* for field memory order */ or field t10 inst[15;14] /* for big endian memory order */

Under this arrangement it is not possible to define t10 independent of the memory order. By permitting the use of sub-fields, the present invention allows t10 to be defined as follows:

field t10 t[1:0]

Since t is defined by the processor core to be inst [7:4] for little endian and inst[17:14] for big endian, t10 is now independent of the memory order.

Test Cases

There are two aspects of the verification of user-specified TIE. The first is to ensure the correctness of the interface between core and TIE blocks and the user-defined states and register files. The second is to verify the correctness of translation of the user semantics into hardware, in other words, the TIE compiler. The first does not depend on the TIE instruction semantics, and it can be derived from the properties of the TIE specification.

It is not possible to write any directed predetermined tests or diagnostics for the user-specified TIE. This problem is approached by deriving the tests from the user TIE specification at the same time the hardware and software for the TIE is generated. The TIE compiler generates the ISA description for the user instructions. The diagnostic generator for TIE reads the ISA description of the TIE instructions. This also includes knowledge about the user-specified states and register files. This information is used the by the generator to create some meaningful set of diagnostics for the user TIE.

The reference semantics provide a method of verification for the implementation semantics. The reference semantics are verified by using them in the target application. As described in the Killian et al. and Wilson et al. applications, the application is modified by the designer to use the new instructions via intrinsics. The modified application and the instruction definitions are tested together either in the simulator or natively. Native execution is facilitated by the ability of the TIE compiler (as in the prior art) to create conventional programming language (e.g., C) definitions of the intrinsics as functions. The use in the target application is usually the best test of instruction definitions.

The correctness of the TIE compiler generating C code is checked by this process, but the translation of TIE code to HDL is not, unless the application is also run in the HDL simulator. However, HDL simulators are generally too slow to do this for many applications. It is therefore desirable to have some other way to test the correctness of the TIE compiler's translation of the input semantics to HDL.

Also, it may be that the designer is unsure if the application covers all of the cases that must be handled by the instruction.

This is important if the application may change after the processor is generated, or if new applications will use this processor. In this case, it is desirable to have other ways to test the instruction. In prior art systems, the instructions of a processor are usually tested by the running of hand-written diagnostics that execute the instruction with a selected set of source operand values and check the result operands for the expected value. The preferred embodiment automates this process by exploiting the additional information that is available from the TIE specification.

The TIE iclass specification lists all of the inputs and outputs of each instruction, whether register file operands, immediates, or processor state registers. The TIE construct

```
test <iname> {
    in { <oname> => <value>, ... }
    out { <oname> => <value>, ... }
    in { <oname> => <value>, ... }
    out { <oname> => <value>, ... }
    ...
}
``` provides a list of source operand values and expected results for instruction <iname>. Here <oname> is the name of an operand or state register, and <value> is the corresponding input value (for in or inout operands or registers in the test in list) or expected value (for out or inout operands, registers, or exception signals in the test out list).

The TIE compiler produces a test program in a conventional programming language (e.g., C) that the in and inout processor registers to the values in the test in list using the WUR intrinsic and the number declared with the TIE user_register construct described in the Wilson et al. application. It then sets up the in and inout register file operands using the intrinsics specified by the proto declaration for loading registers. Operands in core register files (e.g., the AR's in the preferred embodiment) use built-in language types. Next, the TIE compiler invokes the intrinsic with the operands listed in the order specified by the iclass. Next, the out and inout operands specified in the test out list are read and compared to the given expected values. Finally, the processor registers in the test out list are read using the RUR intrinsic and the register number for the user_register construct, and these values are compared to the given values.

This automatically generated programming language diagnostic may be run either in the instruction set simulator, or on the hardware RTL model or natively using the intrinsic-emulating functions generated by the TIE compiler by translating to the target programming language.

As an example, the specification

```
test GFADD8 {
    in { gs => 8'xFF, gt => 8'xA5 }
    out { gr => 8'x5A }
}
test GFMULX8 {
    in { gs => 8'xFF, gfmod => 8'xA5 }
    out { gr => 8'x5B }
}
generates the C diagnostic
    unsigned char GFADD8_0[1] = { 255 };
    unsigned char GFADD8_1[1] = { 165 };
    unsigned char GFADD8_2[1] = { 90 };
    unsigned char GFMULX8_0[1] = { 255 };
```

```
    unsigned char GFMULX8_1[1] = { 91 };
    unsigned char GFMULX8_2[1] = { 165 };
    int
    main (int argc, char *argv[ ])
    {
        for (i = 0; i < 1; i += 1) {
            gf gr;
            gf gs;
            gf gt;
            unsigned char t0;
            LGF8_I (gs, &GFADD8_0[i], 0);
            LGF8_I (gt, &GFADD8_1[i], 0);
            GFADD8 (gr, gs, gt);
            SGF8_I (gr, &t0, 0);
            if (t0 != GFADD8_2[i])
                fail( );
        }
        for (i = 0; i < 1; i += 1) {
            gf gr;
            gf gs;
            unsigned char t0;
            LGF8_I (gs, &GFMULX8_0[i], 0);
            WUR (GFMULX8_1[i], 0);
            GFMULX8 (gr, gs);
            SGF8_I (gr, &t0, 0);
            if (t0 != GFMULX8_2[i])
                fail( );
        }
        return 0;
    }
```

Automatic Sampling of Test Vectors to Produce Test Cases

In cases where running the application is sufficient for testing the correctness of the input instruction semantics, it is still desirable to have test cases for running in the HDL simulator to test the TIE translation of the input semantics. The HDL simulator is in many cases too slow to run the application. It is therefore desirable to have a method for extracting tests from the application running natively or in the instruction set simulator.

The TIE compiler therefore should have an option to augment its translation of the input semantics to the application programming language with code that writes the input and outputs operands of instructions to a file. This file can then be post-processed by eliminating duplicates and then using statistical sampling to extract a number of test cases that is reasonable to simulate in the HDL simulator. These records can then be converted to the TIE test construct described above so that its implementation may be leveraged for the rest of the process.

The motiviation behind using this methodology of generating architectural and microarchitectural tests is to provide a systematic verification process for implementation of the user TIE. This is very important because the user's application may not be sufficient for testing the microarchitecture of the TIE implementation. To generate such diagnostics from the TE description, we employ a method that derivces the necessary information from the ISA description and pipeline information produced by the TIE compiler. This scheme is described below.

ISA Description of the TIE Instructions

In order to be able to configure the processor core according to the user's requirements a configuration is used. A configuration is essentially a list of parts and attributes of the processor core that can customized by the user through a web-based interface. These processor attributes are referred to as configuration parameters. The complete list of the configuration parameters along with their default values and the ranges the values can assume define the configuration space of the processor core. A concrete instantiation of the processor core, that is, an instance of the core in which all the configuration parameters have been assigned concrete values, is a core configuration.

Currently, both the configuration space and concrete core configurations are represented as text files that list the configuration parameters and their values. Even though a flat list of all the configuration parameters and their values enumerated in a text file has the advantage of being easily human readable, it complicates the process of configuring the individual pieces of hardware and software. For that reason, a set of tools have been developed that read the configuration information and create an object-oriented representation of the various parts of the processor and the values of the configuration parameters. The tools and the representation of configurations are collectively known as the configuration environment or configuration database.

During the configuration of the software and hardware, tpp provides a handle to the configuration environment enabling the developer to programmatically access the configuration information, as well as easily compute parts of the source code. In addition, since the computation is performed in the configuration environment and, thus, it is shared across all configured sources, developing configurable source code is simplified.

A PERL library for describing the ISA has been developed. For TIE, the TIE compiler is run to create the PERL objects for the user-defined instructions and this is added to the core ISA. From there on, all the verification tools query these PERL objects to get the ISA and pipeline information of the user-defined TIE.

The following example illustrates how this is done. Starting with a simple TIE description,

```
opcode acc  op2=0  CUST0
state accum  32
user_register 100 accum
iclass acc {acc} {in ars, in art} {inout accum}
reference acc {
    assign accum = accum + ars + art;
}
```

The TIE compiler generates the following information about the TIE user state and the semantic of the instruction using it:

State accum mapped to user register: 100, bits 31:0
opcode: acc, package: UserDefined, size: 20,
Register Operands:
   Name: as: input,
   regfile: AR, shortname:a, size:32 bits, entries:64
   Name: at: input,
   regfile: AR, shortname:a, size:32 bits, entries:64

From the above information, it is possible to generate the assembly code for the TIE instruction acc. It is known that the instruction has two register operands, both of type AR, based on which it is possible to do some random register allocation, or even better, some intelligent register allocation, since the output and input fields are known. It is therefore possible to automatically generate assembly code for this instruction, such as acc $a7, $a13 where a7 and a13 are the s and t fields of the instruction acc generated by a register allocation algorithm that looks at the regfile definition for AR. Some more examples of the ISA description of the TIE instructions:

```
opcode : i128l, package : UserDefined, size : 24, load
   Register Operands:
       Name : i128t:output,
       regfile:i128, shortname:i128, size:128 bits, entries:16
       Name : as: input,
       regfile:AR, shortname:a, size:32 bits, entries:64
   Immediate Operands:
       Name:offset128: bits 8, Table : [0 16 32 48 ...]
opcode : wur0, package : UserDefined, size : 24,
   Register Operands:
       Name : at: input,
       regfile : AR,  shortname:a, size:32 bits, entries:64
opcode : i128s, package : UserDefined, size : 24, store
   Register Operands:
       Name: i128t: input
       regfile:i128, shortname:i128, size:128 bits, entries:16
       Name : as:  input
       regfile : AR,  shortname:a, size:32 bits, entries:64
   Immediate Operands:
       Name:offset128:bits 8, shift 0, Table : [0 16 32 ....]
```

Since it isn't possible to derive enough information about the expected result of the instruction, it is not possible to check the correctness of the TIE semantics. For example, it is not possible to check if the result of the acc instruction is correct in the test. However, if the hardware produced the wrong result in the state accumulator, this would be detected by the cosimulation mechanism that compares all user state and register file between the RTL and ISS at all instruction boundaries as will be described in greater detail in another section. The following sections use some PERL like pseudo code to express algorithms. The diagnostic generators are mostly PERL based programs.

The algorithm used by the diagnostic generator for generating a correct TIE instruction is as follows:

```
subroutine gen_tie_instr
( tie_opcode, address_reg, index_reg)
{
   // address_reg is a core register
   // containing a valid address in case
   // the TIE instruction does a load/store,
   // same for the index register, if the
   // load/store is a indexed load
   foreach operand ( tie_inst->regoperands( ) ) {
       fld = operand->field( );
       reg = &register_allocate(tie_inst, operand);
       if ( (isLoad(tie_inst) || isStore(tie_inst) )
           && operand->name( ) eq 'as' ) {
           override with valid address
           reg = address_reg;
       }
       if ( ( isLoad(tie_inst) || isStore(tie_inst) )
           && operand->name( ) eq 'at' ) {
           reg = index_reg;
       }
       push( operand_list, reg);
   }
   foreach operand ( tie_inst->immoperands( ) ) {
       // specification of immediate operand
       // as a table of values or a range
       range = operand->range( );
       table = operand->table( );
       legal = tie_inst->legals(operand->field( )->name);
       if ( legal ) {
           imm = legal[ random index ];
       } elsif ( range ) {
           imm = random value between range.lo and range.hi;
       } elsif ( table ) {
           imm = table[ random index ];
       }
```

```
                push( operand_list, imm);
            }
        }
        subroutine register_allocate ( tie_inst, register_operand) {
            name = register_operand->shortname( );
            numentries= register_operand->entries( );
            legalrange =
              tie_inst->legals(register_operand->field( )->name( ));
            if ( legalrange ) {
                register_num = legalrange[ random index ];
            } else {
                register_num = random(0, numentries−1 );
            }
            return concatenate( name, register_num );
        }
```

Also, before it is possible to start executing TIE instructions, it is necessary to initialize the TIE state and register files. This is done in the following way:

```
        subroutine initTieState ( address_reg, data_reg ) {
            // Iterate over all state and get the vaue
            // for each user register that
            // the states are mapped to
            states = (tie->states( ),
            map($_->states( ), tie->coprocessors( )) );
            foreach state ( states ) {
                UserRegMask{state->userReg} = getMask;
            }
            foreach ureg( keys of the hashtable UserRegMask ) {
                mask the data register with the mask value
                do a WUR to the ureg
            }
            // Initialize register files by loading from a
            // valid memory location
            regfiles = (tie->regfiles( ),
            map($_->regfiles( ), tie->coprocessors( )) >
            foreach regf ( regfiles ) {
                for( i=0; i<regf->entries( ); i++ ) {
                    generate the load instruction or instruction sequence
                    using the addr_reg that has the valid address to load
                    index i of register file regf.
                }
            }
        }
```

Pipeline Information for TIE

To generate microarchitectural diagnostics that test the bypass and interlock logic in TIE, pipeline information of TIE instruction is needed. This provides a knowledge of the stages at which resources such as registers and states are read and written by a TIE instruction. Once again, the TIE compiler provides this information and it is represented in PERL objects and used by the verification tools. Taking the following example with a user-defined register file and a set of instructions which simply moves data at different stages of the pipeline, note the convention 1: E stage, 2: M stage, 3: W stage:

```
                regfile i128  128  16  i128
                operand i128s s {i128[s]}
                operand i128t t {i128[t]}
                operand i128r r {i128[r]}
                opcode I128L r=0 LSCI
                opcode I128S r=1 LSCI
```

```
                opcode I128AND op2=0 CUST0
                schedule load {I128L} {
                    def i128t 2;
                }
```

This translates to the following in the PERL database:
Regfile i128 width 128 entries 16 instructions:

```
                Writes:
                    stage 2: Inst i128and: Field r
                    stage 3: Inst i128l: Field t
                Reads:
                    stage 1: Inst i128s: Field t
                           Inst i128and: Field s
                           Inst i128and: Field t
```

One can see how this information is used to generate diagnostics in the next section.

Microarchitectural Tests for TIE

A goal of this section is to generate micro-architectural diagnostics for the TIE logic based on the knowledge of the implementation of the interface between TIE and the core, as well as that of TIE state and register file, if any. The ISA and pipeline description of the TIE itself are used; however, as mentioned earlier, the "correctness" of the implementation of TIE instruction is not verified in the test directly.

A set of MVP diagnostics are generated to test the following aspects of the implementation:

control logic in the core/tie interface; and implementation of user state and register files, including loads/stores and bypass and interlock logic.

Control Signals Between Core and TIE

Exceptions, interrupts and replay signals are tested by generating tests where every user instruction is killed by an control flow change in the core (e.g., a branch), exception and replay signals. The instruction should be killed in all stages of its execution, right up to the completion stage.

The algorithm to generate these tests simply iterate over all TIE opcodes in the ISA description generated by the TIE compiler and construct each of the following cases:

```
        Case a) TIE instruction killed by a change of flow:
        foreach tie_opcode ( tie_opcode_list )
        branch instr ( branch taken)
        tie_opcode
        end // foreach
        Case b) TIE instruction killed by an exception
        foreach tie_opcode ( tie_opcode_list )
        for (stage=0;
            stage < completion stage of tie_opcode;
            stage++ )
        syscall or break instr (that generates an exception)
        <stage> number of nops
        tie_opcode
        end // for
        end // foreach
```

As can be seen, the number of no-ops between the instruction generating the exception and the TIE instruction controls the stage of TIE instruction execution at which it gets killed.

```
Case c) TIE instruction replayed in the pipeline
    foreach tie_opcode ( tie_opcode_list )
        isync instr
        tie_opcode
    end
```

Bypass Logic for User State and Register File:

These tests will exercise the bypass logic for the TIE state and register file by "pairing" instructions that write/read them. The test will ensure that there are no stalls on account of instruction and data fetch and then (if the configuration permits) check the cycle count register before and after the instruction sequence to look for any unnecessary stalls and flag that as an error. The algorithm is as follows:

Generate a list of [instr, field] for all read/write stages to a particular register file or state. Check what is the maximum completion stage for this state/regfile. Now pair up the write and read instructions, varying the number of nops in between up to the maximum completion stage.

```
foreach regf ( tie->regfiles( ) ) {
    //list of the stages at which regf is read
    // possibly (1,2)
    readstages = getReadStages( regf );,
    // list of stages at which regf is written
    // possibly (2,3)
    writestages = getDefStages( regf );
    foreach wstage ( writestages ) {
        writelist = Generate list of [instr, field] pairs
            that write regf in stage wstage
        max_nops =
        maximum_completion_stage for regf – wstage ;
        foreach rstage ( readstages ) {
            readlist = Generate list of [instr, field]
                pairs that read regf in stage rstage
        }
        foreach write_instr ( writelist ) {
            foreach read_instr ( readlist ) {
                for( i=0; i<max_nops; i++ ) {
                    stalls =
                    (wstage-rstage-1) if ( wstage > rstage ) else 0;
                    ccount_before = read cycle count
                    write_instr
                    I – nops
                    read_instr
                    ccount_after = read cycle count
                    if (( ccount_after – ccount_before)
                        != ( stalls + nops + 3 ) )
                        ERROR !!
                }
            }
        }
    }
}
```

It is necessary to guarantee that there are no I$ and D$ misses by executing the instruction sequence twice. In the second iteration, a cycle count check is done. The expected number of cycles depends on the read/write stages and nops. Some examples cases for the example above are:

```
#(i1281 field t stage 3) -> (i128and Field s Stage 1),
#nops=0, stall 1 cycles
Test_11:
    rsr $a3, 234 <-- read cycle count before
    i1281 $i1280,$a10,0
        | ->
        |
    i128and $i1285,$i1280,$i1281
    rsr $a4, 234 <--- cycle count after
    addi $a3, $a3, 4
    beq a4, a3, PASS_11
    j FAIL
PASS_11:
#(i128and field r stage 2) -> (i128and Field s Stage 1),
#nops=0, stall 0 cycles,
Test_12:
    rsr $a3, 234
    i128and $i1280,$i1288,$i1284
        | ->
        |
    i128and $i1286,$i1280,$i1285
    rsr $a4, 234
    addi $a3, $a3, 3
    beq a4, a3, PASS_12
    j FAIL
PASS_12:
#(i128and field r stage 2) -> (i128and Field s Stage 1),
# nops=1, stall 0 cycles,
Test_13:
    rsr $a3, 234
    i128and $i1280,$i1288,$i1284
    nop.n
    i128and $i1286,$i1280,$i1285
    rsr $a4, 234
    addi $a3, $a3, 4
    beq a4, a3, PASS_13
    j FAIL
PASS_13:
```

Interlocks and hazards

This tests for correct stalls in the case of read-after-write, write-after-write and (possibly) write-after-read hazard cases.

The algorithm for the hazard cases is derived similarly to that of the bypass case described above. There are two instructions that write the same regfile in stages 2 and 3, followed by an instruction that reads it in stage 1. The third instruction stalls for the result of the second write.

```
#(Inst i128and r 2) ->
#(Inst i1281 t 3) ->
#(Inst i128and s 1)
Test_1:
    rsr $a3, 234
    i128and $i1280,$i1289,$i1281
    i1281 $i1280,$a5,0
    i128and $i12815,$i1280,$i12813
    rsr $a4, 234
    addi $a3, $a3, 5
    beq a4, a3, PASS_1
    j FAIL
PASS_1:
```

Loads/Stores

Loads and stores to all register files are tested comprehensively for all aligned and misaligned addresses using the following algorithm:

```
foreach regf ( tie->regfiles( ) ) {
    PIFbytes = PIFWidth >> 3; // bytes
    PIFwords = PIFbytes >> 2; // words ( eg 4 for 128 bit )
    regfw = regf->size( ) >> 5;
    for ( k = 0; k< PIFbytes; k++ ) {
        load_address = PIFWidth-aligned address + k;
        store_address = PIFWidth-aligned address + k;
```

-continued

```
    * initialize memory
    * store known data into load address
    * store a default value to the store address
    for ( i=0; i<PIFwords; i++ ) {
      * store data_word to load_address + i
      * store default_word to store_address + i
    }
    * do the load from load address
    * do the store to store address
    expected_result =
    expected_tie_load_result( load_address, data);
    for ( i=0; i<PIFw; i++ ) {
      result = load a word from store_address + i
      if ( i <regfw) {
        check result == expected_result
      } else {
        check result == default_word
      }
    }
  }
}
```

The expected result of the load depends on the load semantics, and although it can be determined for most cases, it may not be possible to do so for all possible semantics, in which case it is necessary to leave the checking to the state and memory compare.

Data breakpoints for TIE load/store instructions are also tested for TIE load/store instructions in the case where the configuration supports data breakpoints. The details of how the data breakpoints work for TIE instructions can be found in the load/store architecture section. The diagnostics generated test the data breakpoints for all possible combinations of the data break address register, the control mask register and the virtual address for the load/store.

```
foreach regf ( tie->regfiles( ) ) {
  regfw = regf->size( ) >> 5;
  write dbreak register with an address aligned to regfw
  foreach mask ( set of masks for regfw ) {
    * write dbreak control mask
    * set address register based
      on mask and dbreak address
    * do a load/store to regf that
      takes a data breakpoint exception
    * check if exception was taken
  end
end
```

Data breakpoints that match will cause a debug exception. The debug exception handlers for the above test will update a counter that will be checked to ensure that the exception was indeed taken. In addition to this, more complex cases are also constructed where the load/store with data breakpoint coincides with overflow/underflow exceptions (for register windowing) to ensure the correct priority of such exceptions.

Random Diagnostic Generators for TIE Instructions

Random diagnostics play a major role in the verification of the core ISA, and the microarchitecture of the implementation as well. The random sequence of instructions are likely to hit boundary cases and other scenarios that are unlikely to be covered by a directed test. They also adds to the coverage metrics for the design verification. Additional intelligence has been added to these random generators by adding some features. For example, templates of instruction sequences can be created to target specific interesting scenarios. An example of this can be back-to-back stores that fill up the write-buffer, or a zero-overhead loop with a single instruction. Relative probabilities attached to each type of instruction or instruction sequence can decide how often one wants to generate a particular kind of instruction; for example, if a branch instruction has a high relative probability (or weight), the test generated will have more branches. User-controlled parameters can tune the nature of tests generated. For example, command line arguments can control the relative weight of certain instructions, the length of tests, the number of nested function calls, etc. The random diagnostic generators can generate user-defined TIE instructions as well.

The underlying mechanism is similar to that of the microarchitectural tests. The random generators read the ISA description that includes TIE instructions as well as the core ISA. Valid TIE instructions are constructed by looking at the ISA description of a particular TE instruction, and employing some register allocation mechanism:

```
foreach operand (tie_instr->operands( ) ) {
  if ( operand is TIE register file ) {
    do a random register allocation
    random(0, #entries in register file)
  } elsif ( operand is a core register file ) {
    if (this is a load/store instr ) {
      this is the address register
      for the load/store operation.
      Find a core register that can be written,
      and write a valid address
    } else {
      random core register
    }
  } elsif immediate field {
    generate a random immediate value based on the
    instruction's immediate table or range
  }
}
```

The random generators are preferably not accessible by end-users of the configuration system but are employed for internal verification and for a whole range of TIE descriptions such as those described above and further including exhaustive cases of TIE register files of varying widths, such as 8; 16, 32, 64, 128 bits, and states. Additionally, end-users may be given access to the random generators for use in further verification.

Coverage Measurements for TIE Verification

As stated above, a goal of this verification effort is to ensure the correctness of the core and TIE interface, the implementation of the user-defined state and register file and associated logic and the correct translation of the TIE instruction into hardware. Some coverage metrics of these areas are necessary.

This is not meant to refer to basic design coverage of the RTL generated by the TIE compiler, but more to functional coverage in the areas mentioned. Although it is extremely hard to make such coverage assessments for TIE, ways have been developed to generate some functional coverage modules that run along with the RTL and report some coverage measures. One important area, for example, is all the bypass paths between the TIE register files and states. The diagnostics generated to test bypass should cover all possible bypass paths, but the goal is to have an independent confirmation of that in RTL. To do so, some Verilog/VERA modules are automatically generated from the TIE description and the pipeline information. These modules run during RTL simulation time to report which bypass paths were covered.

Figure 13:
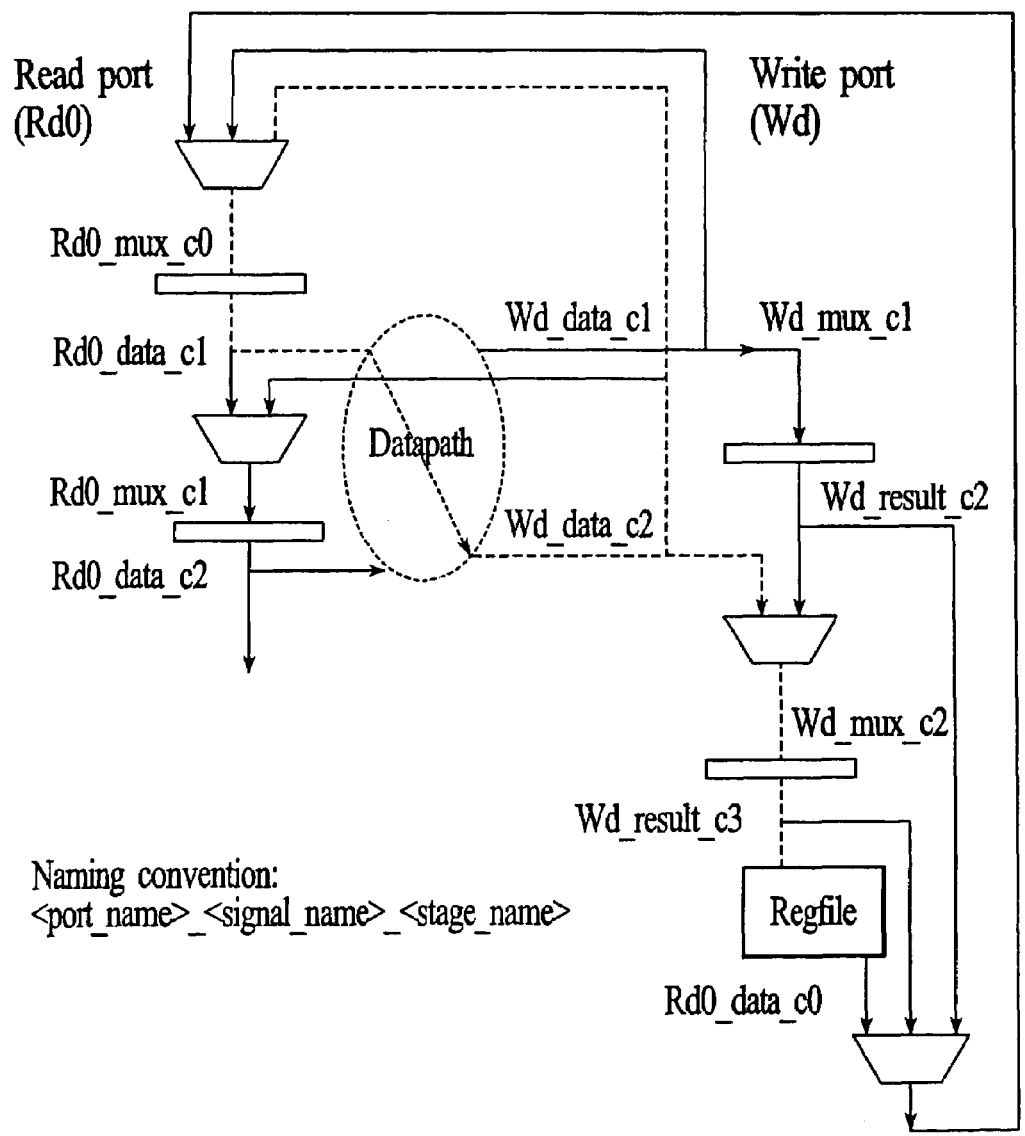
FIG. 13 shows a TIE verification process according to the preferred embodiment.

Taking the example of the 128 bit register file i128 already seen in the previous sections, FIG. 13 shows such a general purpose register file, and the implementation in hardware. The figure shows one read port Rd0 and one write port wd. Typically, there are two read ports and one write port for the register file. The naming convention for the signals is:

<port_name>_<signal_name>_<stage_name>
where
port_name: name of the register file port (Rd0, Rd1, Wd)
signal_name: the signal names are:
  read port: mux: output of mux,
    data: output of a flip-flop that goes to the datapath unit of TIE
  write port: mux: output of a mux,
    data: output of the datapath unit
    result: output of a flip-flop
stage_name: this indicates the stage of the pipeline.

As stated in a previous section, the convention here is:
C0: R stage, C1: E stage, C2: M stage, C3: W stage For the sake of simplicity, the following discussion restricts all TIE instructions to write the register file no later than the end of the M-stage.

The block diagram shows the different bypass paths for these stages. For the read port Rd0, which is read by the datapath in stages 1 and 2 (this was represented as the use of the register file in the previous sections), the following traces or explains the block diagram:

```
Stage C0:
Rd0_mux_C0 = select from (
Wd_data_C2 :
  the result produced by the instr last in the pipeline
Wd_data_C1 :
  the result produced by the instr before last
  in the pipeline
Rd0_data_C0: The current data in the register file
)
Stage C1:
Rd0_data_C1 <= Rd0_mux_C0
where <= implies after a clock cycle
Rd0_mux_C1 = select from (
Wd_data_C2 :
  the result produced by the instr last in the pipeline
Rd0_data_C1: the result of the previous stage
)
Stage C2:
Rd0_data_C2 <= Rd0_mux_C1
```

The write port wd, which is written in stages 2 and 3, has a similar bypass path:

```
Stage C2:
Wd_result_C2 <= Wd_mux_C1 = Wd_data_C1
(the only source for the write port in
stage C1 is the output of the instruction in E stage)
Wd_mux_C2 = select from (
Wd_result_C2
Wd_data_C2 : result of the current instr in M stage
)
Stage C3:
Wd_result_C3 <= Wd_nux_C2
Wd_result_C3 is written to the register file.
```

Coverage of Bypass Paths

A goal of the preferred embodiment is to generate a monitor that checks if all the bypass paths in the above block diagram have been exercised. An example bypass path is traced in the dashed path in FIG. 13. The monitor essentially traces the data through the paths, and hence it is necessary to make a very important assumption, which is that the data remains unchanged in the datapath unit of TIE. This means that the following check can be performed:

Wd_data_C1==Rd0_data_C1 with the assumption that a TIE instruction that reads data in the E stage (C1) and produces the output data in the E-stage leaves the data unchanged. This is of course untrue for any real TIE instruction. However, for the sake of testing some "identity" instructions in the user TIE (to be eliminated for generating real hardware) are introduced. These instructions, solely for testing, essentially copy data. In this example, two identity instructions are obtained:

Identity 1: use C1, def C1 which reads the register file in the E stage, and produces the same data in the E stage; and Identity 2: use C1, def C2: which produces data after a cycle delay.

Having described the premises of the monitor generation, now the algorithm for generating a Vera module that tests if all the bypass paths were exercised will be described. Once again, the information generated by the TIE compiler is used and the signal name convention stated above is followed.

```
foreach regf ( list of register files ) {
  foreach writeport ( writeports of regf ) {
    foreach writestage (
      list of stages writeport is written ) {
        foreach readport ( readports of regf ) {
          foreach readstage (
            list of stages readport is read) {
              skip if writestage < readstage
              generate_the_signal_list( regf->name,
                writeport->name, writestage,
                readport->name, readstage,
                list_of_write_stages_for_writeport )
            } // readstage
        } //readport
    }// writestage
  } //writeport
} // regf
```

The workings of the subroutine that generates the signal list is omitted for the sake of simplicity, but will be apparent to those skilled in the art. One important note is how the datapath is represented in the list of signals. If the datapath has a write stage >read stage (for example, the Identity 2 instruction above), the number of cycles spent in the datapath unit (which is up to one, in accordance with our restriction of two cycle TIE instructions for this discourse) are simply added.

The path that is shown in dashed lines in FIG. 13 is generated as a signal list or trace from the above algorithm as:

```
i128_wd_data_C2->
i128_rd0_mux_C0->
i128_rd0_data_C1->
waitcycles1->
i128_wd_data_C2->
i128_wd_mux_C2->
i128_wd_result_C3
``` where i128 is the register file name. The path to the TIE register file i1128 from the top level of Xtensa is prepended to this. Notice that the dashed line from Rd0_data_C1->Wd_data_C2 in the datapath in FIG. 13 has been represented as wait cycles 1 in the signal trace.

A list of such signal traces are generated for all the bypass paths. Based on the signal trace, a small monitor module is generated in Verilog/Vera that checks if this path has been traced. If so, it reports a 1 for this path at the end of the simulation. Each monitor is essentially a small state machine that is generated by the algorithm:

```
a) Determine the number of states in the state machine
   number of states = number of stages (from E) in signal trace +
   in state m/c number of cycles in the datapath
b) Group the signals according to state
c) Generate code :
   state = 0;
   foreach state ( states in FSM ) {
      if ( last state in list ) {
         * reset state
         * set flag to 1 for covered
      } else {
         if ( signals in this state ) {
            generate if expression to advance to next state
         } else {
            advance to next state
         }
      }
   }
}
```

The state machine generated for the example bypass path is: case (state)

```
case (state)
{
   0 :
   {
      if (<hierarchy>.i128__rd0__mux__C0 ==
          <hierarchy>.i128__wd__data__C2){
         state = 1;
      }
   }
   1 :
   {
      if (<hierarchy>.i128__rd0__data__C1 ==
          <hierarchy>.i128__rd0__mux__C0){
         state = 2;
      }
   }
   2:
   {
      int__state = 3; // waitcycles 1
   }
   3 :
   {
      if (<hierarchy>.i128__wd__result__C3 ==
          <hierarchy>.i128__wd__mux__C2){
         state = 0;
         result__flag = 1'b1;
      }
   }
}
```

Verification Summary

To test the correctness of the input reference instruction semantics, the TIE coder modifies the application to use the new instructions using intrinsics and then either (1) compiles this to machine code and runs the application with the instruction set simulator or (2) compiles to native code and uses the macros and functions output by the TIE compiler to provide intrinsic compatibility. The correctness of the application verifies the correctness of the instruction reference semantics with either of these two options. The translation of the reference semantics is verified by option 2, and the correctness of the extended compiler and simulator is verified by option 1. Additional coverage beyond that provided by the application is by the use of the test case TIE construct to generate tests of specific cases (e.g., unusual or "corner" cases).

The implementation semantics may be verified by using a TIE compiler option to translate these instead of the reference semantics using the same methods as above. The implementation semantics and their translation to HDL may also be formally verified similar to the reference semantics by commercial equivalence checking tools working on the translation of each to HDL. Implementation semantics and their translation are also checked by the use of the TIE-specified test cases run in the HDL simulator.

The HDL generated by the TIE compiler for the register files, interlock, bypass, core interface, and exceptions is verified by running automatically-generated tests based on the TIE input and using cosimulation to verify the results. These tests use the pipeline specification to exhaustively test all combinations of interlock, bypass, and exceptions.

The HAL code generated by the TIE compiler is verified by executing it in the instruction set simulator. The assembler and compiler support for the new instructions is verified by most of the above.

Cosimulation of Processors

Co-simulation is the process of running the RTL and the reference model in parallel, and comparing the architecturally visible states defined in the ISA at specified boundaries.

The cosimulator (hereinafter "cosim") acts as the synchronizer and the gateway between the RTL simulator, the ISS, and multiple other monitor/checker tasks that are executed in parallel. A diagnostic fails as soon as a mismatch occurs between the RTL and the ISS or when an assertion checker signals a catastrophic event.

There are several advantages of using cosimulation. First, it provides easier debugging of failing diagnostics. It causes the simulation to stop at (or near) the cycle where the problem appeared, which significantly reduces debugging time and effort.

Second, it provides more state checking. It allows observability of the processor state throughout the program execution, thereby signaling those cases that create erroneous intermediate results while producing a correct final result.

Finally, with cosimulation there is no need for self-checking. Random diagnostics can be run and checked.

In the preferred embodiment, the ISS is the reference model and the boundaries are defined on instruction retirements and whenever external events occur. The set of architecturally visible states to be compared is configurable. One of the challenges of using cosim with configurable processors is the absence of complete knowledge regarding the process of comparing RTL and ISS. What is known about comparing RTL and ISS is that the comparison needs to occur on instruction retirement boundaries and on occurrences of external events. However, the processor state that should be compared between RTL and ISS depends on the processor options the user elects to include in her configuration. When a processor option is not included in a specific configuration of the processor core, then the cosim environment should not even attempt to compare the state introduced by the option, since the state is not present in either the RTL or the ISS. Thus, the preferred embodiment uses a cosim environment that is configurable and which is customized along with the software and hardware during the processor configuration.

How the Cosim Works with TIE

The ability of the user to extend the processor state as well as the instruction set using TIE complicates the cosim process since the cosim environment needs to be developed with no complete prior knowledge of the processor states and instruction set. In the presence of TIE, the cosim environment needs to be able to determine the new processor state that should be compared/validated as well as decide the boundaries at which the new state will compared between the RTL and ISS. In order for cosim to be able to achieve these two requirements/goals, it requires information regarding the new processor state defined in TIE. The information required by cosim includes the names of the new states, the width of the state elements, the complete RTL hierarchy (path) defining the states, whether the state is defined on reset or not, whether it is an individual state or a register file, and the number of entries when the state is a register file.

Figure 14:
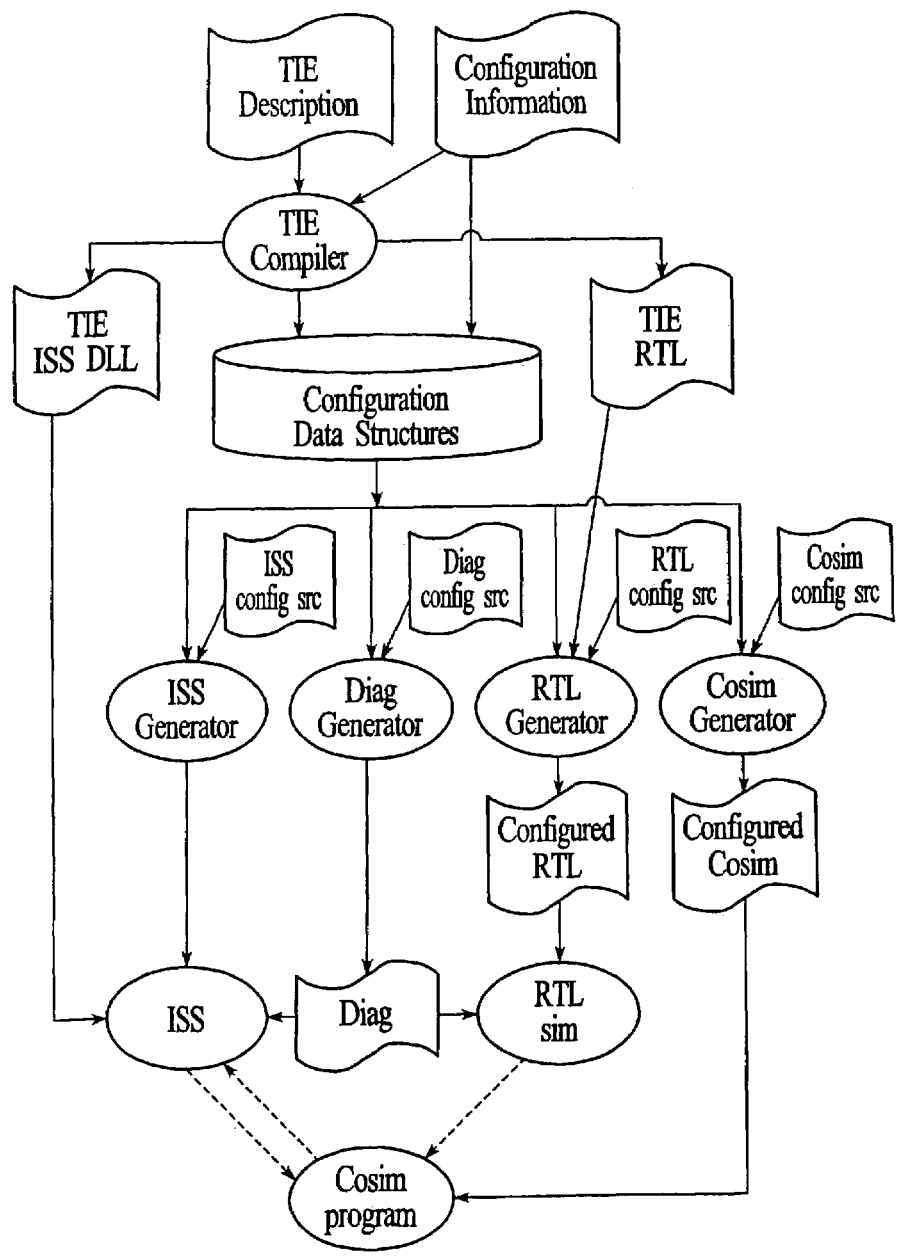
FIG. 14 shows a cosimulation process in the preferred embodiment.

The information required by cosim is generated from the user's TIE description in three steps. First, as shown in FIG. 14, the TIE compiler parses the TIE description and generates an intermediate representation of the states defined in the input file. This intermediate representation is subsequently used by the cosim preprocessor to generate the cosim source code necessary for the verification of the new TIE state. Finally, the generated cosim code is integrated with the rest of the cosim framework to produce the cosim environment specific to the given configuration. This is preferably done using tpp to generate code in the Vera™ cosimulation language as implemented in, e.g., the Vera™ System Verifier by Synopsys, Inc. of Mountain View, Calif.

The following section contains examples of the cosim preprocessor and the generated cosim source code obtained in connection with the Galois field TIE example presented earlier.

```
# ------------------------------------------------------ #
# CosimInfo.pm creates arrays which contains state and   #
# register files information for TIE and the core.       #
# ------------------------------------------------------ #
            @CosimInfo::EXPORT = qw(
                                    @RegisterFiles
                                    @SpecialRegister
                                    @IntrType
                                    @TieState
                                    @TieRegister
                                    @AllRegFiles
                                    @AllSpecialRegs);
# ------------------------------------------------------ #
# For a given configuration:                             #
#       SpecialRegister contains all the core            #
#                       special registers' names         #
#       RegisterFiles   contains all the core            #
#                       register files names             #
# ------------------------------------------------------ #
@SpecialRegister = map (CoreState($_, 1),
                        grep($_->name ne 'MEM', $isa->state));
@RegisterFiles = map (CoreState($_, 0),
                        grep($_->name ne 'MEM', $isa->state));
# ------------------------------------------------------ #
# For a given tie description:                           #
#       TieState    contains all the TIE states names    #
#       TieRegister contains all the TIE register files  #
#       names
# ------------------------------------------------------ #
@TieState    = map (TieState($_, 1),
                        $pr->tie( )->allStates( ));
@TieRegister = map (TieState($_, 0),
                        $pr->tie( )->allStates( ));
@AllRegFiles = (@RegisterFiles, @TieRegister);
@AllSpecialRegs = (@SpecialRegister, @TieState);
# ------------------------------------------------------ #
# TieState subroutine reads the TIE state and            #
# register information from the configuration data base. #
# ------------------------------------------------------ #
sub TieState {
    my ($state, $tieState) = @_;
    my $name = $state->name( );
    my $entries = $state->entries( );
    my $width = $state->width( );
    my $undefonreset = !($state->initialized( ));
    my $regfile = $state->isRegFile( );
    if ($tieState) {
            return if ($regfile);
            [$name, $width == 1 ? 1 : $width, $undefonreset];
    } else {
            return if (!$regfile);
            [$name, $width == 1 ? 1 : $width, $entries];
    }
}
Cosim Source Code (Tie Register File comparison):
; foreach(@TieRegister) {
    ; my ($regName, $regWidth, $regEntries) = @$_;
    ; for($i = 0; $i < $regEntries; $i++) {
    ;       $tn = $regName . $i;
```

-continued

```
        iss_'$tn' = $iss_read_register_bitvec('$i'+'$regName'_start);
        if(rtl_'$tn'[index] != iss_'$tn') {
            printf("Cosim @ cycle %0d PC %h:\n\tRTL != ISS TIE Reg File
'$tn' %h %h\n\n", current_cycle, rtl_spreg_pc[index], rtl_'$tn'[index],
iss_'$tn');
        }
    ; }
; }
Cosim output program (Tie register file comparison):
    iss_gf0 = $iss_read_register_bitvec(0+gf_start);
        if(rtl_gf0[index] != iss_gf0) {
            printf("Cosim @ cycle %0d PC %h:\n\tRTL != ISS TIE Reg File
gf0 %h %h\n\n", current_cycle, rtl_spreg_pc[index], rtl_gf0[index], iss_gf0);
    ...
    iss_gf15 = $iss_read_register_bitvec(0+gf_start);
        if(rtl_gf15[index] != iss_gf15) {
            printf("Cosim @ cycle %0d PC %h:\n\tRTL != ISS TIE Reg File
gf15 %h %h\n\n", current_cycle, rtl_spreg_pc[index], rtl_gf0[index],
iss_gf15);
Cosim source code (Tie State comparison):
        ; foreach (@TieState) {
            ; ($sreg) = @$_;
            // Checking Special Register '$sreg'
            iss_'$sreg' = $iss_read_register_bitvec('$sreg'_map);
            if(rtl_spreg_'$sreg'[index] != iss_'$sreg') {
                iss_'$sreg' = $iss_read_register_bitvec('$sreg'_map);
                printf("Cosim @ cycle %0d PC %h:\n\tRTL != ISS at TIE State
'$sreg' %0h %0h\n\n", current_cycle, rtl_spreg_pc[index],
rtl_spreg_'$sreg'[index], iss_'$sreg');
            }
        ; }
Cosim output program (Tie State comparison):
        // Checking Special Register gfmod
        iss_gfmod = $iss_read_register_bitvec(gfmod_map);
        if(rtl_spreg_gfmod[index] != iss_gfmod) {
            iss_gfmod = $iss_read_register_bitvec(gfmod_map);
            printf("Cosim @ cycle %0d PC %h:\n\tRTL != ISS at TIE State gfmod
%0h %0h\n\n", current_cycle, rtl_spreg_pc[index], rtl_spreg_gfmod[index],
iss_gfmod);
        }
```

Thus, in summary, to adapt the simulator described in the Killian et al. application to work in the preferred embodiment a number of changes primarily having to do with generalizations to state must be made. Because TIE state can be arbitrarily wide, an interface is needed to register values that are arbitrarily sized, but it is preferred that the interface not be used all the time for performance reasons. Because of this, the registers are partitioned into classes, and the gdb and cosim interfaces are modified so that they can find a class and an index within a class from a single integer code. The socket interface is changed so that arbitrary width values can be transmitted and received. New memory interfaces are added to support wide loads and stores. The initialization of TIE state is generalized to support register files and assignment of registers to coprocessors. Support for simulating pipeline delays associated with access of TIE state is also added. The interface to TIE state is modified to simulate the CPENABLE exception.

Summary

In summary, then, the major new TIE constructions discussed above, the generated files which they affect and their general purposes are given below in TABLE III.

| Construct | Generated files | Purposes/Tasks |
|---|---|---|
| Subfield of another field | Libisa-<tie>.a<br>Libiss-<tie>.a | Support memory-order-independent field |
| TIE modules | <tie>.v<br>customer.isa<br>Libiss-<tie>.a<br>Cstub-<tie>.c<br><tie>.v<br>Verification files | definitions<br><br>Support efficient hardware implementations of instructions without writing complex semantic descriptions |
| Register operand | Libisa-<tie>.a<br>Libcc-<tie>.a<br>Libiss-<tie>.a<br>Cstub-<tie>.c<br>Xtensa-<tie>.h<br><tie>.v<br>customer.isa | For defining instructions with register operands for user-defined register files<br>Basic entity used in register file read/write ports allocation |
| Iclass interface clause | Xtensa-<tie>.h<br>Libiss-<tie>.a<br><tie>.v<br>cstub-<tie>.c<br>Verification files | Capture interactions between TIE instructions and Xtensa core |
| Interface | Libcc-<tie>.a<br>Libiss-<tie>.a<br>Cstub-<tie>.c<br>Xtensa-<tie>.h<br><tie>.v | Allow TIE instructions to access certain Xtensa core functionality |
| Schedule | Libcc-<tie>.a<br>Libiss-<tie>.a<br><tie>.v<br>customer.isa | Generate multicycle implementation of instructions<br>Schedule code for maximal efficiency<br>Simulate instructions |

-continued

| Construct | Generated files | Purposes/Tasks |
|---|---|---|
| Regfile | Libisa-<tie>.a<br>Libcc-<tie>.a<br>Libiss-<tie>.a<br>Cstub-<tie>.c<br>Xtensa-<tie>.h<br><tie>.v<br>customer.isa | with accurate clock cycle count<br>Use coprocessor register files for more efficient computation |
| Synopsis<br>Description<br>Impl_note<br>Assm_note | Customer.isa | Generate documentation for TIE instructions |
| Ctype | Libcc-<tie>.a | Support new data types in C for ease of programming and automatic register allocation |
| Proto | Libcc-<tie>.a<br>Xtensa-<tie>.h | Provide additional information for automatic register allocation<br>Support automatic conversion of C types<br>Support instruction idioms |
| Reference | Libisa-<tie>.a<br>Libcc-<tie>.a<br>Libiss-<tie>.a<br>Cstub-<tie>.c<br>Xtensa-<tie>.h<br><tie>.v<br>customer.isa | Provide reference definition for TIE instructions<br>Check for correctness of semantic descriptions of TIE instructions |
| Coprocessor | Customer.isa<br>Libiss-<tie>.a | Group register files and states into coprocessors to support lazy context switching |

The present invention has been described above in connection with a preferred embodiment thereof; however, this has been done for purposes of illustration only, and the invention is not so limited. Indeed, variations of the invention will be readily apparent to those skilled in the art and also fall within the scope of the invention.

Appendices A, B and D are included in a compact disc accompanying this application, the contents of which are incorporated by reference herein. The compact disc includes the following files: Wang—Application—Appendix A (2).txt, created Nov. 15, 2005, 541 KB; Wang—Application—Appendix B (2).txt, created Nov. 15, 2005, 61 KB; and Wang—Application—Appendix D (2).txt, created Nov. 15, 2005, 14 KB.

Appendix C is attached hereto, the contents of which are incorporated by reference herein.

What is claimed is:

1. A system for designing a configurable processor, the system comprising:
hardware generation means for, based on a configuration specification including a predetermined portion and a user-defined portion, generating a description of a hardware implementation of the processor; and
software generation means for, based on the configuration specification, generating software development tools specific to the hardware implementation;
wherein the user-defined portion of the configuration specification includes scheduling information for one or more instructions executed by the processor;
and wherein the hardware generation means includes means for, based on the scheduling information, determining whether and how to generate a description of the logic of at least one pipeline stage and pipeline stalling logic for inclusion in the description of the hardware implementation of the processor.

2. The system of claim 1, wherein the scheduling information includes a statement that an operand of an instruction enters a pipeline of the processor at a given stage.

3. The system of claim 1, wherein the scheduling information includes a statement that an operation of an instruction exits a pipeline of the processor at a given stage.

4. The system of claim 1, wherein:
the software generated by the software generation means includes a compiler which uses instructions described in the user-defined portion of the configuration specification; and
the compiler uses the scheduling information during instruction scheduling to schedule the instructions described in the user-defined portion of the configuration specification.

5. The system of claim 1, wherein the configuration specification includes a description of an instruction which requires a plurality of processor cycles to be processed.

6. The system of claim 5, wherein:
the user-defined portion of the configuration specification includes a description of an Instruction's semantics, the description of the instruction's semantics being independent of a description of a target pipeline for the instruction; and
the hardware generation means includes means for generating, for inclusion in the description of the processor hardware implementation, logic consistent with the target pipeline based on the configuration specification.

7. The system of claim 1, wherein the scheduling information includes the number of execution stages for the instruction(s).

8. The system of claim 7, wherein the hardware generation means includes means for determining a number of pipeline registers consistent with the number of specified execution stages to include in the description of the processor hardware implementation.

9. The system of claim 1, wherein:
the software generated by the software generation means includes a compiler which uses instructions described in the user-defined portion of the configuration specification; and
the compiler uses the scheduling information during instruction scheduling to schedule the instructions to match a target pipeline in the generated description of the hardware implementation.

10. The system of claim 1, wherein the hardware generation means includes means for generating, for inclusion in the description of the hardware implementation of the processor, interlock logic for accessing a register file of the processor.

11. The system of claim 10, wherein the means for generating the interlock logic generates the interlock logic based on the scheduling information in the configuration specification.

12. The system of claim 10, wherein the means for generating the interlock logic generates the interlock logic for a given pipeline of the processor described by the configuration specification based on instruction operand and state usage descriptions in the scheduling information.

13. A method for designing a configurable processor, the method comprising:
based on a configuration specification including a predetermined portion and a user-defined portion, generating a description of a hardware implementation of the processor; and further based on the configuration specification, generating software development tools specific to the hardware implementation;

wherein the user-defined portion of the configuration specification includes scheduling information for one or more instructions executed by the processor;

and wherein the step of generating the hardware description includes, based on the scheduling information, determining whether and how to generate a description of the logic of at least one pipeline stage and pipeline stalling logic for inclusion in the description of the hardware implementation of the processor.

14. The method of claim 13, wherein the scheduling information includes a statement that an operand of an instruction enters a pipeline of the processor at a given stage.

15. The method of claim 13, wherein the scheduling information includes a statement that an operation of an instruction exits a pipeline of the processor at a given stage.

16. The method of claim 13, wherein:
the generated software includes a compiler which uses instructions described in the user-defined portion of the configuration specification; and
the compiler uses the scheduling information during instruction scheduling to schedule the instructions described in the user-defined portion of the configuration specification.

17. The method of claim 13, wherein the configuration specification includes a description of an instruction which requires a plurality of processor cycles to be processed.

18. The method of claim 17, wherein:
the user-defined portion of the configuration specification includes a description of an Instruction's semantics, the description of the instruction's semantics being independent of a description of a target pipeline for the instruction; and
the step of generating the hardware description includes generating, for inclusion in the description of the processor hardware implementation, logic consistent with the target pipeline based on the configuration specification.

19. The method of claim 13, wherein the scheduling information includes the number of execution stages for the instruction(s).

20. The method of claim 19, wherein the step of generating the hardware description includes determining a number of pipeline registers consistent with the number of specified execution stages to include in the description of the processor hardware implementation.

21. The method of claim 13, wherein:
the software generated by the software generation means includes a compiler which uses instructions described in the user-defined portion of the configuration specification; and
the compiler uses the scheduling information during instruction scheduling to schedule the instructions to match a target pipeline in the generated description of the hardware implementation of the processor.

22. The method of claim 13, wherein the step of generating the hardware description includes generating, for inclusion in the description of the hardware implementation of the processor, interlock logic for accessing a register file of the processor.

23. The method of claim 22, wherein the step of generating the interlock logic includes generating the interlock logic based on the scheduling information in the configuration specification.

24. The method of claim 22, wherein the step of generating the interlock logic includes generating the interlock logic for a given pipeline of the processor described by the configuration specification based on instruction operand and state usage descriptions in the scheduling information.

* * * * *